US010720519B2

United States Patent
Shirakawa et al.

(10) Patent No.: US 10,720,519 B2
(45) Date of Patent: Jul. 21, 2020

(54) SEMICONDUCTOR DEVICE AND MANUFACTURING METHOD OF SEMICONDUCTOR DEVICE

(71) Applicant: FUJI ELECTRIC CO., LTD., Kanagawa (JP)

(72) Inventors: Tohru Shirakawa, Matsumoto (JP); Hidenori Takahashi, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/417,681

(22) Filed: May 21, 2019

(65) Prior Publication Data

US 2019/0273156 A1    Sep. 5, 2019

Related U.S. Application Data

(63) Continuation of application No. 15/418,788, filed on Jan. 30, 2017, now Pat. No. 10,297,682, which is a
(Continued)

(30) Foreign Application Priority Data

Feb. 16, 2015 (JP) .................................. 2015-027746

(51) Int. Cl.
*H01L 29/739* (2006.01)
*H01L 21/225* (2006.01)
(Continued)

(52) U.S. Cl.
CPC ...... *H01L 29/7397* (2013.01); *H01L 21/2253* (2013.01); *H01L 21/26513* (2013.01);
(Continued)

(58) Field of Classification Search
CPC ............. H01L 29/7393; H01L 29/7394; H01L 29/7395; H01L 29/7396; H01L 29/7397; H01L 29/7398
See application file for complete search history.

(56) References Cited

U.S. PATENT DOCUMENTS 6,204,533 B1    3/2001 Williams et al.
2002/0140027 A1    10/2002 Mo et al.
(Continued)

FOREIGN PATENT DOCUMENTS

CN    1983597 A    6/2007
JP    H11-243196 A    9/1999
(Continued)

OTHER PUBLICATIONS

International Search Report for International Application No. PCT/JP2016/054201, issued by the Japan Patent Office dated May 10, 2016.
(Continued)

*Primary Examiner* — Mohammed R Alam

(57) ABSTRACT

A semiconductor device includes one or more trench gates extending in a first direction in plan view, one or more first-conductivity-type regions spaced away from each other in the first direction, where the first-conductivity-type regions are shallower than the trench gates, one or more second-conductivity-type regions alternating with the first-conductivity-type regions in the first direction, where the second-conductivity-type regions are shallower than the trench gates and deeper than the first-conductivity-type regions, and a second-conductivity-type trench spacer region spaced away from the one or more trench gates, where the trench spacer region has a higher concentration than the second-conductivity-type regions. Here, the trench spacer region is positioned within the first-conductivity-type
(Continued)

regions in plan view and closer to a back surface of the semiconductor device than the first-conductivity-type regions are.

8 Claims, 22 Drawing Sheets

Related U.S. Application Data continuation of application No. PCT/JP2016/054201, filed on Feb. 12, 2016.

(51) Int. Cl.
    *H01L 29/06*     (2006.01)
    *H01L 29/10*     (2006.01)
    *H01L 21/265*     (2006.01)
    *H01L 29/66*     (2006.01)

(52) U.S. Cl.
    CPC ...... *H01L 29/0696* (2013.01); *H01L 29/1095* (2013.01); *H01L 29/66348* (2013.01)

(56) References Cited

U.S. PATENT DOCUMENTS

| | | | |
|---|---|---|---|
| 2005/0079676 A1* | 4/2005 | Mo | ............... H01L 29/0696 |
| | | | 438/268 |
| 2008/0087951 A1 | 4/2008 | Takaya | |
| 2008/0308839 A1 | 12/2008 | Okada | |
| 2010/0327313 A1 | 12/2010 | Nakamura | |
| 2013/0234200 A1 | 9/2013 | Fuji | |
| 2015/0372090 A1 | 12/2015 | Oosawa | |

FOREIGN PATENT DOCUMENTS

| | | |
|---|---|---|
| JP | 2000-031484 A | 1/2000 |
| JP | 2012-028567 A | 2/2012 |
| JP | 2012-114321 A | 6/2012 |
| WO | 2014-112015 A1 | 7/2014 |

OTHER PUBLICATIONS

Office Action issued for counterpart Japanese Application 2017-500654, issued by the Japan Patent Office dated Sep. 5, 2017.

Office Action issued for counterpart Chinese Application No. 201680002108.1, issued by the State Intellectual Property Office dated Nov. 2, 2018.

Office Action issued for counterpart Chinese Application No. 201680002108.1, issued by the State Intellectual Property Office dated Apr. 12, 2019.

International Preliminary Report on Patentability for International Application No. PCT/JP2016/054201, issued by the International Bureau of WIPO dated Aug. 22, 2017.

* cited by examiner

US 10,720,519 B2

SEMICONDUCTOR DEVICE AND MANUFACTURING METHOD OF SEMICONDUCTOR DEVICE

CROSS-REFERENCE TO RELATED APPLICATIONS

This application is a continuation of U.S. patent application Ser. No. 15/418,788, filed on Jan. 30, 2017, which claims priority to Japanese Patent Application NO. 2015-027746, filed on Feb. 16, 2015, and PCT Patent Application NO. PCT/JP2016/054201, filed on Feb. 12, 2016, the contents of each of which are hereby incorporated herein by reference in their entirety.

BACKGROUND

1. Technical Field

The present invention relates to a semiconductor device and a manufacturing method of a semiconductor device.

2. Related Art

In the conventional art, a trench semiconductor structure is known in which $n^+$-type source regions and $p^+$-type regions are alternately arranged along trench gates. In the trench semiconductor structure, the gaps between the trench gates are made smaller by omitting the $p^+$-type regions to face the back surfaces of the $n^+$-type source regions (see, for example, Japanese Patent Application Publication NO. 2012-114321).

Since the $p^+$-type regions are not provided below the $n^+$-type source regions in the conventional trench semiconductor structure, however, sufficient reverse biased safe operating area (RBSOA) cannot be assured if mask misalignment occurs for the $n^+$-type source regions or the $p^+$-type regions.

SUMMARY

A first aspect of the innovations herein may include a semiconductor device including one or more trench gates extending in a first direction in plan view, one or more first-conductivity-type regions spaced away from each other in the first direction, where the first-conductivity-type regions are shallower than the trench gates, one or more second-conductivity-type regions alternating with the first-conductivity-type regions in the first direction, where the second-conductivity-type regions are shallower than the trench gates and deeper than the first-conductivity-type regions, and a second-conductivity-type trench spacer region spaced away from the one or more trench gates, where the trench spacer region has a higher concentration than the second-conductivity-type regions. Here, the trench spacer region is positioned within the first-conductivity-type regions in plan view and closer to a back surface of the semiconductor device than the first-conductivity-type regions are.

A second aspect of the innovations herein may include a manufacturing method for a semiconductor device including a trench gate extending in a first direction in plan view, and a plurality of first-conductivity-type regions and a plurality of second-conductivity-type regions alternating each other in the first direction. Here, the manufacturing method includes forming the plurality of first-conductivity-type regions so as to be spaced away from each other in the first direction, implanting ions into the plurality of first-conductivity-type regions, and forming a trench spacer region of a second conductivity type so as to be spaced away from the trench gate. Here, the trench spacer region has a portion that overlaps a given one of the plurality of first-conductivity-type regions in plan view and that is positioned closer to a back surface of the semiconductor device than the given first-conductivity-type region is.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

First Embodiment

Figure 1A:
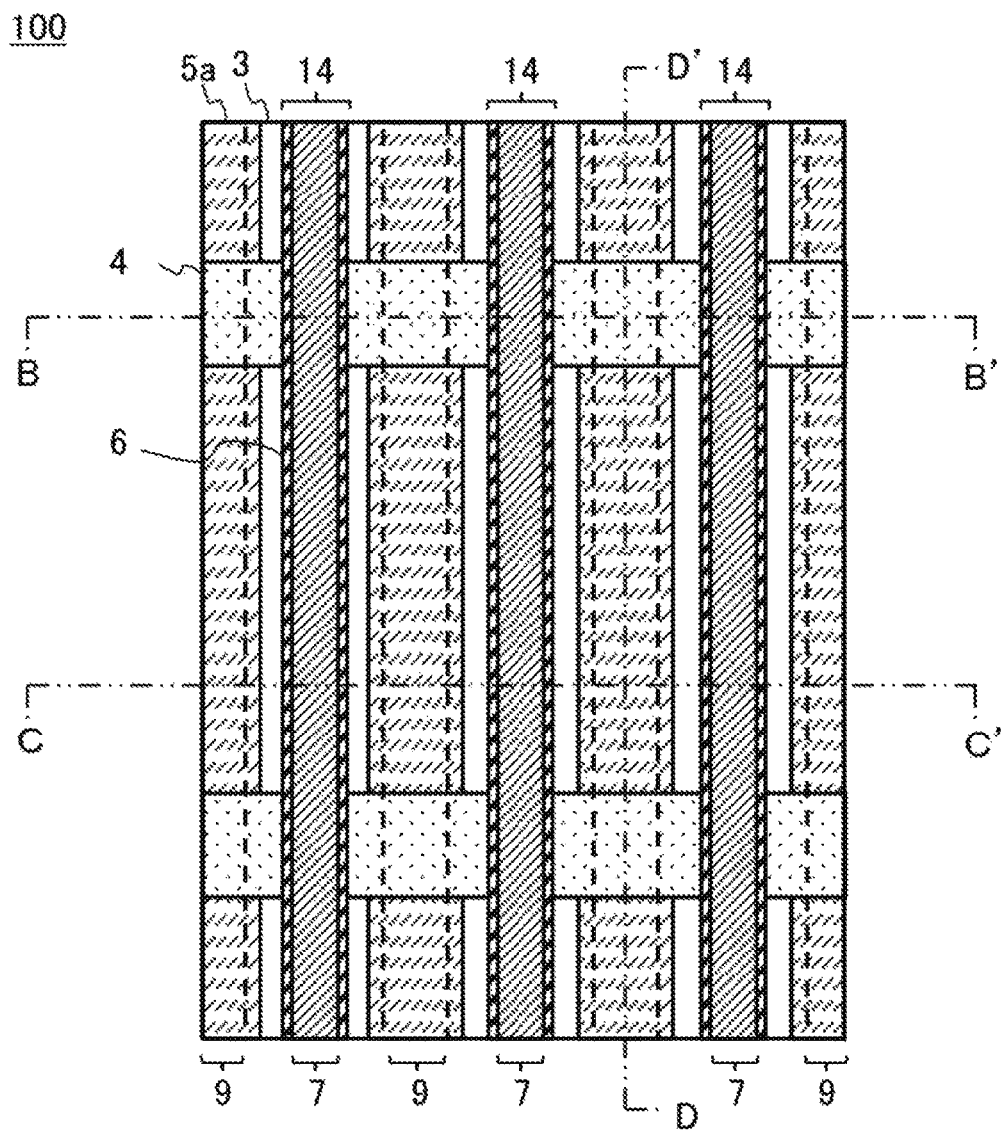
FIG. 1A is a plan view showing as an example a semiconductor device 100 along an A-A' cross-section thereof.
Figure 1B:
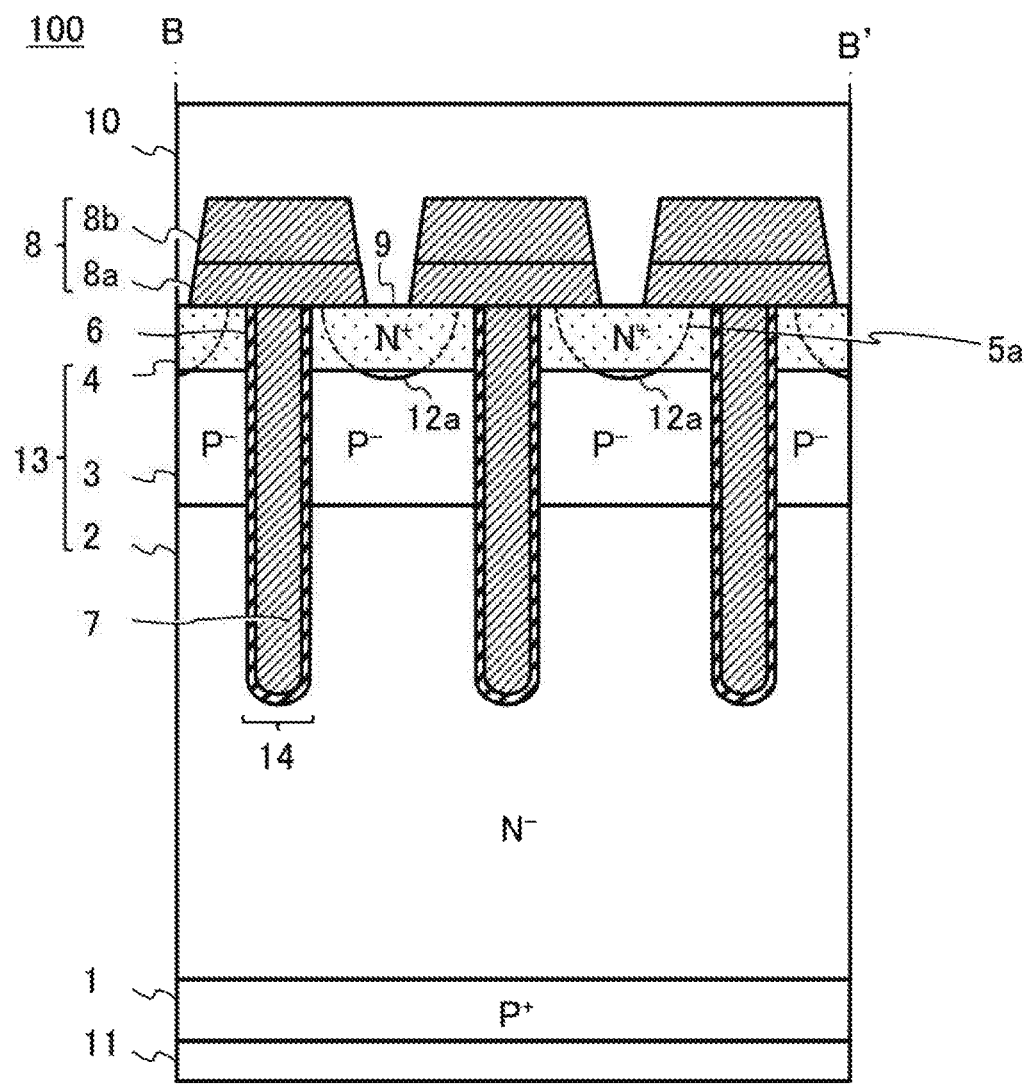
FIG. 1B shows an exemplary structure of the semiconductor device 100 along a B-B' cross-section thereof.
Figure 1C:
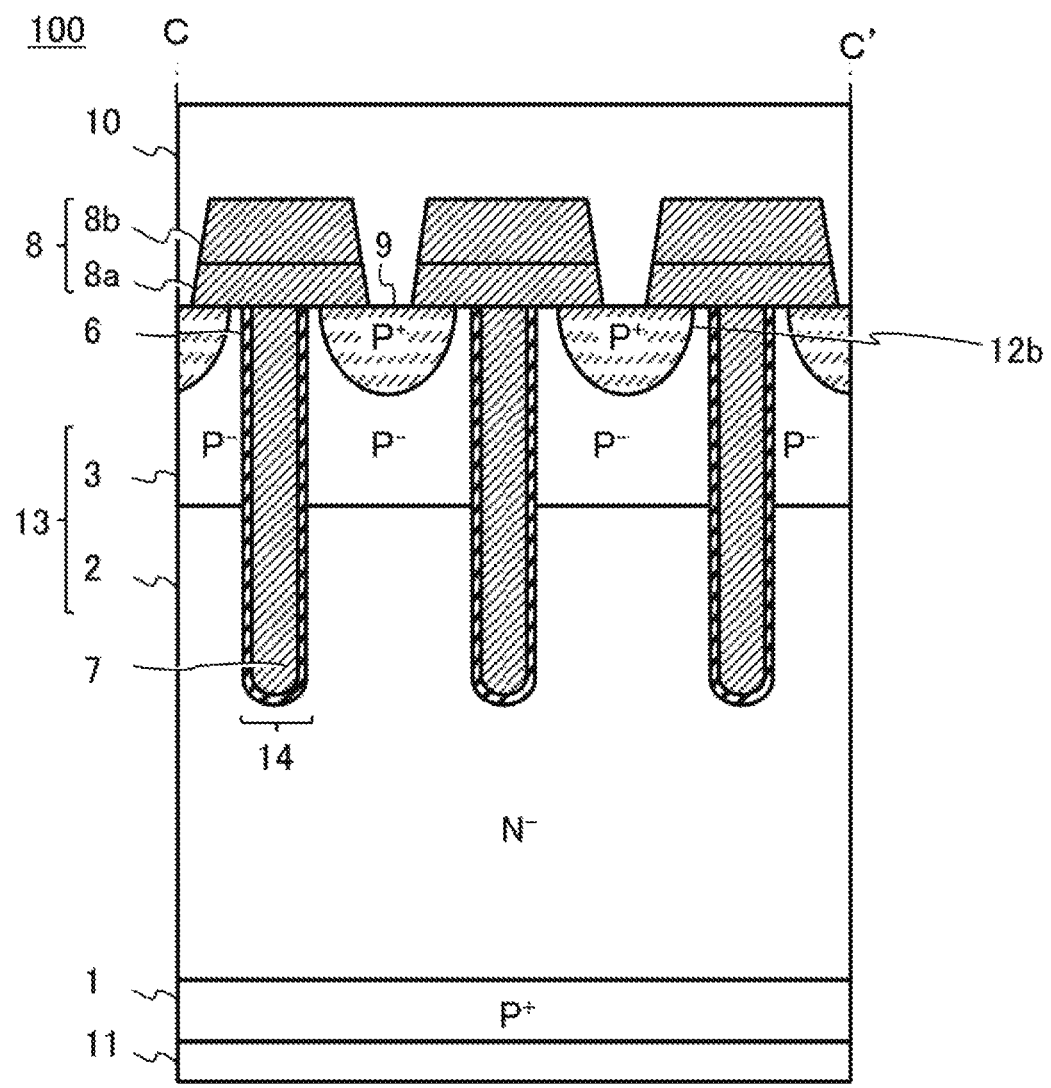
FIG. 1C shows an exemplary structure of the semiconductor device 100 along a C-C' cross-section thereof.
Figure 1D:
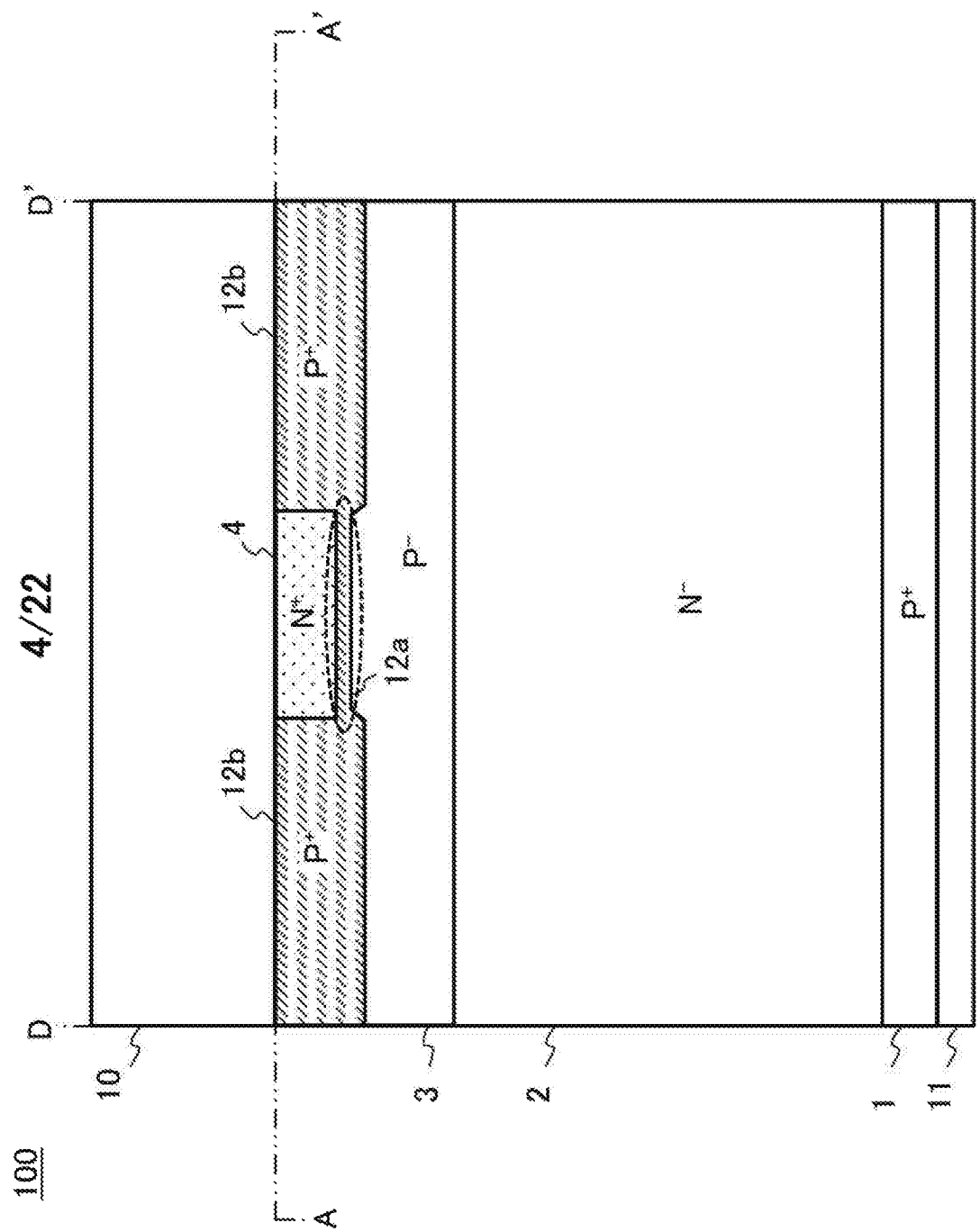
FIG. 1D shows an exemplary structure of the semiconductor device 100 along a D-D' cross-section thereof.

FIGS. 1A to 1D schematically show the structure of a semiconductor device 100 relating to a first embodiment. FIG. 1A is a plan view showing as an example the semiconductor device 100. FIG. 1B shows an exemplary structure of the semiconductor device 100 along a B-B' cross-section thereof. The B-B' cross-section is the cross-section along an $n^+$-type source region 4 in plan view. FIG. 1C shows an exemplary structure of the semiconductor device 100 along a C-C' cross-section thereof. The C-C' cross-section is the cross-section along a region excluding the $n^+$-type source region 4. FIG. 1D shows an exemplary structure of the semiconductor device 100 along a D-D' cross-section thereof. The D-D' cross-section is the cross-section along a contact opening region 9. When the semiconductor device 100 is seen in plan view, the semiconductor device 100 is seen in the direction perpendicular to the surface of the substrate of the semiconductor device 100.

The semiconductor device 100 includes a p-type collector layer 1, a drift layer 2, a p-type base region 3, an $n^+$-type source region 4 and a trench gate 7. The drift layer 2, the p-type base region 3 and the $n^+$-type source region 4 are formed in a semiconductor substrate 13. According to the present example, the semiconductor device 100 is an insulated gate bipolar transistor (IGBT). The semiconductor device 100 has an emitter electrode 10 on the front surface thereof and a collector electrode 11 on the back surface thereof.

In plan view, a plurality of trenches 14 are arranged on the front surface of the semiconductor substrate 13 and extend in a predetermined direction. On the inner walls of the trenches 14, a gate oxide film 6 is formed. The trench gates 7 are embedded in the trenches 14 to be surrounded by the gate oxide film films 6. As used herein, "a trench depth direction" refers to the direction in which the trench gates 7 extend in plan view. In addition, "a trench width direction" refers to the direction perpendicular to the direction in which the trench gates 7 extend in plan view. The pitch of the trench gates 7 may be 5 µm or less, or less than 5 µm, preferably 2.4 µm or less.

The respective p-type base regions 3 are evenly formed on the front surface of the drift layer 2. In plan view, the p-type base regions 3 are formed along the side walls of the trenches 14 and spaced away from each other in the trench depth direction by the $n^+$-type source regions 4. Meanwhile, the $n^+$-type source regions 4 are spaced away from each other in the trench width direction in plan view. The p-type base regions 3 and the $n^+$-type source regions 4 alternate with each other in the trench depth direction in plan view. The width of the $n^+$-type source regions 4 in the trench depth direction may be as fine as 1 µm or less as on the mask.

P-type trench spacer regions 12 are formed in the mesa regions on the surface portion of the drift layer 2, which are sandwiched between the trenches 14. In plan view, the trench spacer regions 12 are p-type semiconductor regions extending in the trench depth direction of the trench gates 7. The trench spacer regions 12 are part of contact diffusion regions 5a, which are formed by diffusing p-type dopants to achieve a high concentration. Here, the trench spacer regions 12 are separated away from the trench gates 7 and the gate oxide film 6.

The trench spacer regions 12 include a trench spacer embedded region 12a, which is sandwiched between the $n^+$-type source region 4 and the p-type base region 3, and a trench spacer surface region 12b, which is formed on the surface of the p-type base region 3. The trench spacer embedded region 12a connects together two adjacent trench spacer surface regions 12b under the $n^+$-type source region 4. In this manner, the two adjacent trench spacer surface regions 12b are electrically connected to each other. The impurity concentration of the trench spacer regions 12 is higher than the impurity concentration of the p-type base regions 3.

In plan view, the trench spacer embedded region 12a is positioned within the $n^+$-type source region 4 and on the back surface side with respect to the $n^+$-type source region 4. As used herein, "the back surface side" refers to the arrangement closer to the collector electrode 11 of the semiconductor device 100. The trench spacer embedded region 12a is formed in such a manner that the contact diffusion region 5a diffuses out of the $n^+$-type source region 4 into the p-type base region 3. The trench spacer embedded region 12a is only required to have such a thickness that the trench spacer embedded region 12a can electrically connect the adjacent trench spacer surface regions 12b. For example, the trench spacer embedded region 12a may have a thickness of 0.3 µm or less, more preferably 0.1 µm or less.

The depth of the trench spacer region 12 may be equal to or less than half the intervals between the trenches 14. Here, the intervals between the trenches 14 refers to the shortest distance between one of the trenches 14 and an adjacent one of the trenches 14. The depth of the trench spacer region 12 refers to the diffusion depth from the surface through which the ions are implanted, or the position in the trench spacer region 12 that is the closest to the back surface of the semiconductor device 100.

In plan view, the trench spacer surface region 12b is positioned within the p-type base region 3. In the present example, after the p-type base region 3 and the $n^+$-type source region 4 are formed, the trench spacer region 12 is formed by diffusion. The trench spacer embedded region 12a is formed by diffusing p-type dopants within the $n^+$-type source region 4. Accordingly, the diffusion is difficult to take place. Meanwhile, the trench spacer surface region 12b is formed by diffusing p-type dopants within the p-type base region 3. Accordingly, the diffusion is easy to take place. For these reasons, the diffusion for the trench spacer surface region 12b reaches deeper than the diffusion for the trench spacer embedded region 12a. Stated differently, the trench spacer embedded region 12a is shallower than the trench spacer surface region 12b.

An interlayer insulating film 8 is formed on the $n^+$-type source region 4 and the p-type base region 3. The interlayer insulating film 8 may be a dual layer structure constituted by a first interlayer insulating film 8a and a second interlayer insulating film 8b. For example, the first interlayer insulating film 8a is a high temperature oxide (HTO) film. The second interlayer insulating film 8b may be a boron phosphorus silicate glass (BPSG) film. The interlayer insulating film 8 has therein a contact opening region 9, which is formed by etching and designed to connect the emitter electrode 10 to one of the p-type base region 3 and the $n^+$-type source region 4.

As discussed above, the trench spacer region 12 is spaced away from the trench gate 7 and extends in the trench depth direction. Therefore, the trench spacer region 12 attracts holes in the vicinity of the $n^+$-type source region 4. As a result, the semiconductor device 100 can achieve improved RBSOA. Here, the RBSOA represents the region defined by the collector-emitter voltage and the collector current in which the IGBT can be turned off without breaking down. The IGBT having a large safe operating area is highly unlikely to be damaged by reverse bias.

First Comparative Example

Figure 2A:
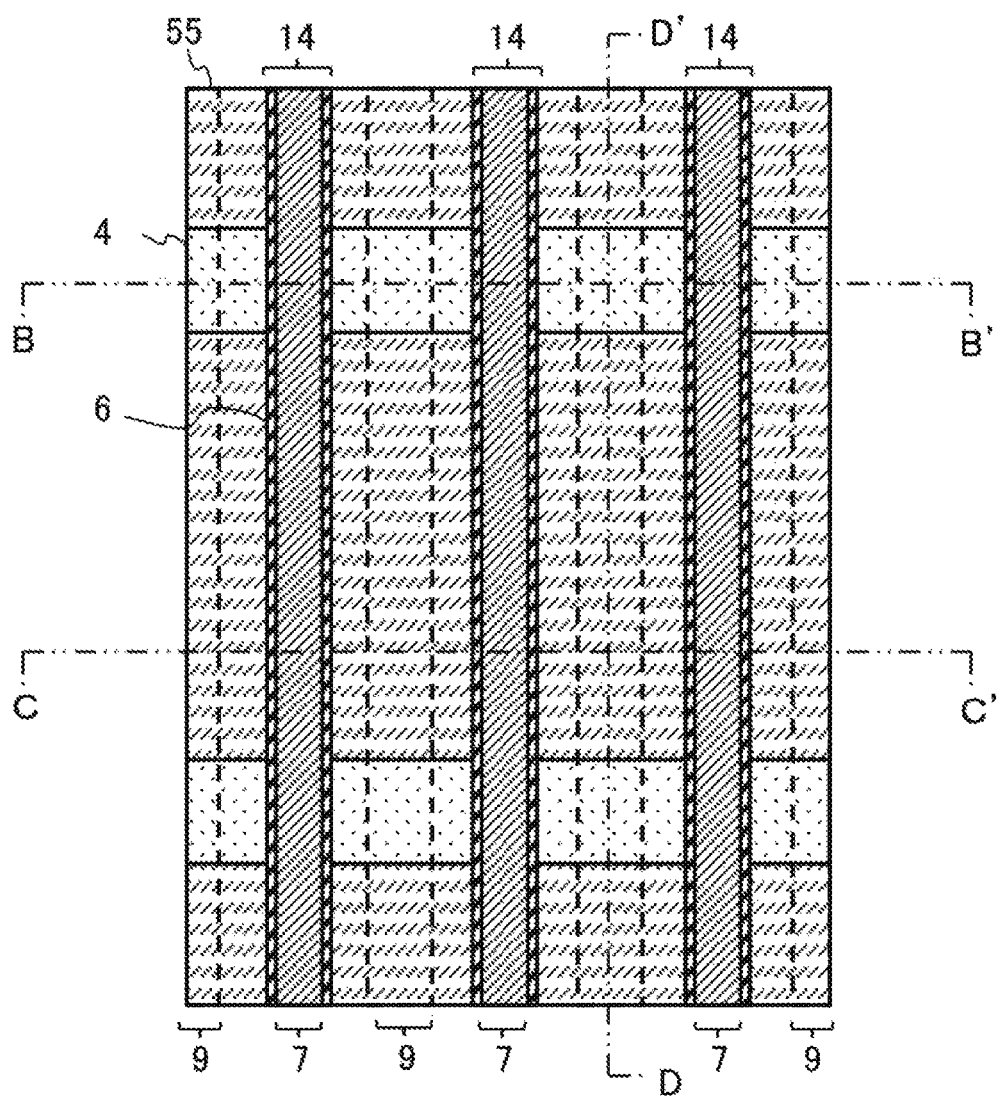
FIG. 2A is a plan view showing as an example a semiconductor device 500 along a A-A' cross-section thereof.
Figure 2B:
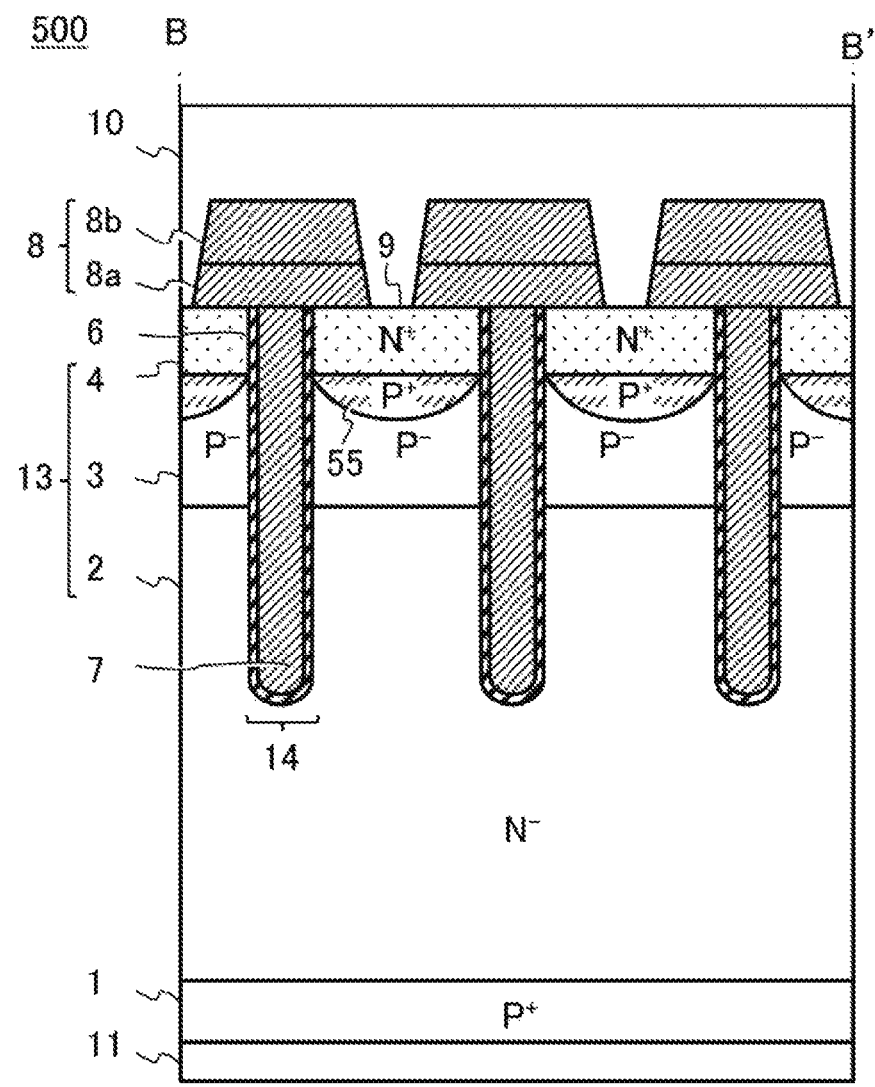
FIG. 2B shows an exemplary structure of the semiconductor device 500 along a B-B' cross-section thereof.
Figure 2C:
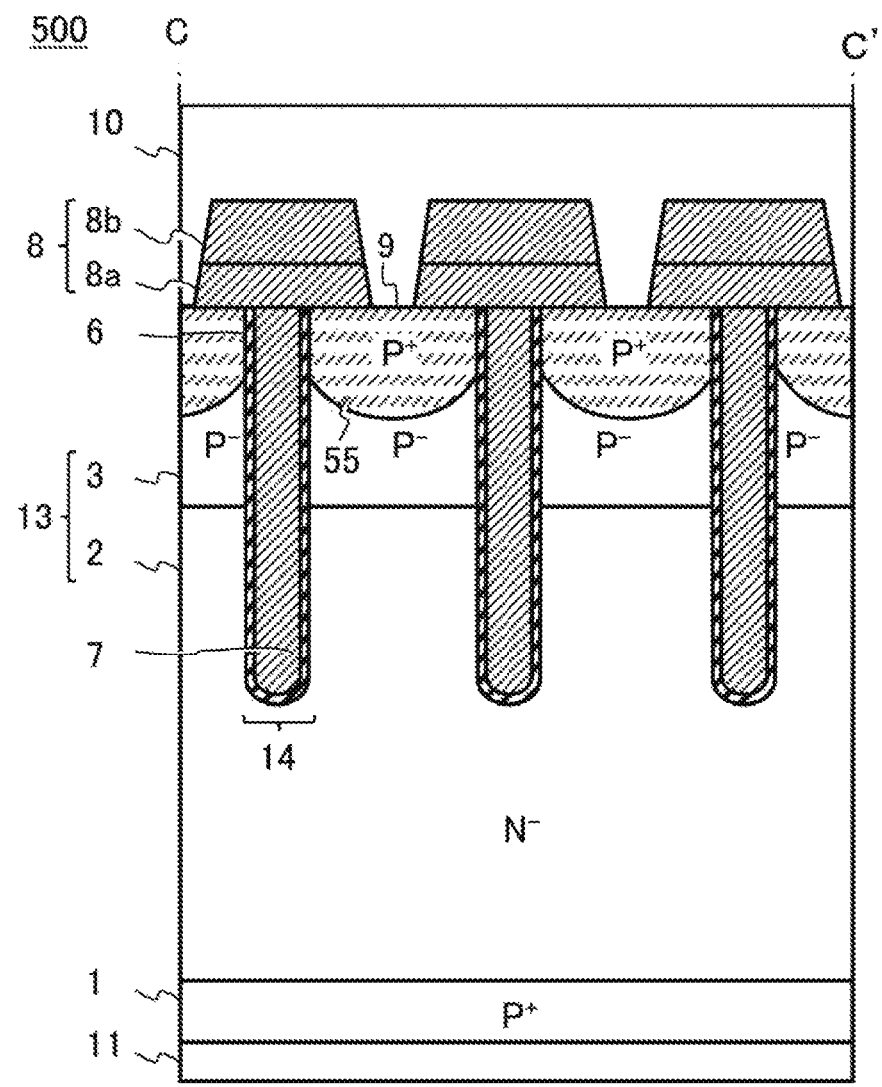
FIG. 2C shows an exemplary structure of the semiconductor device 500 along a C-C' cross-section thereof.
Figure 2D:
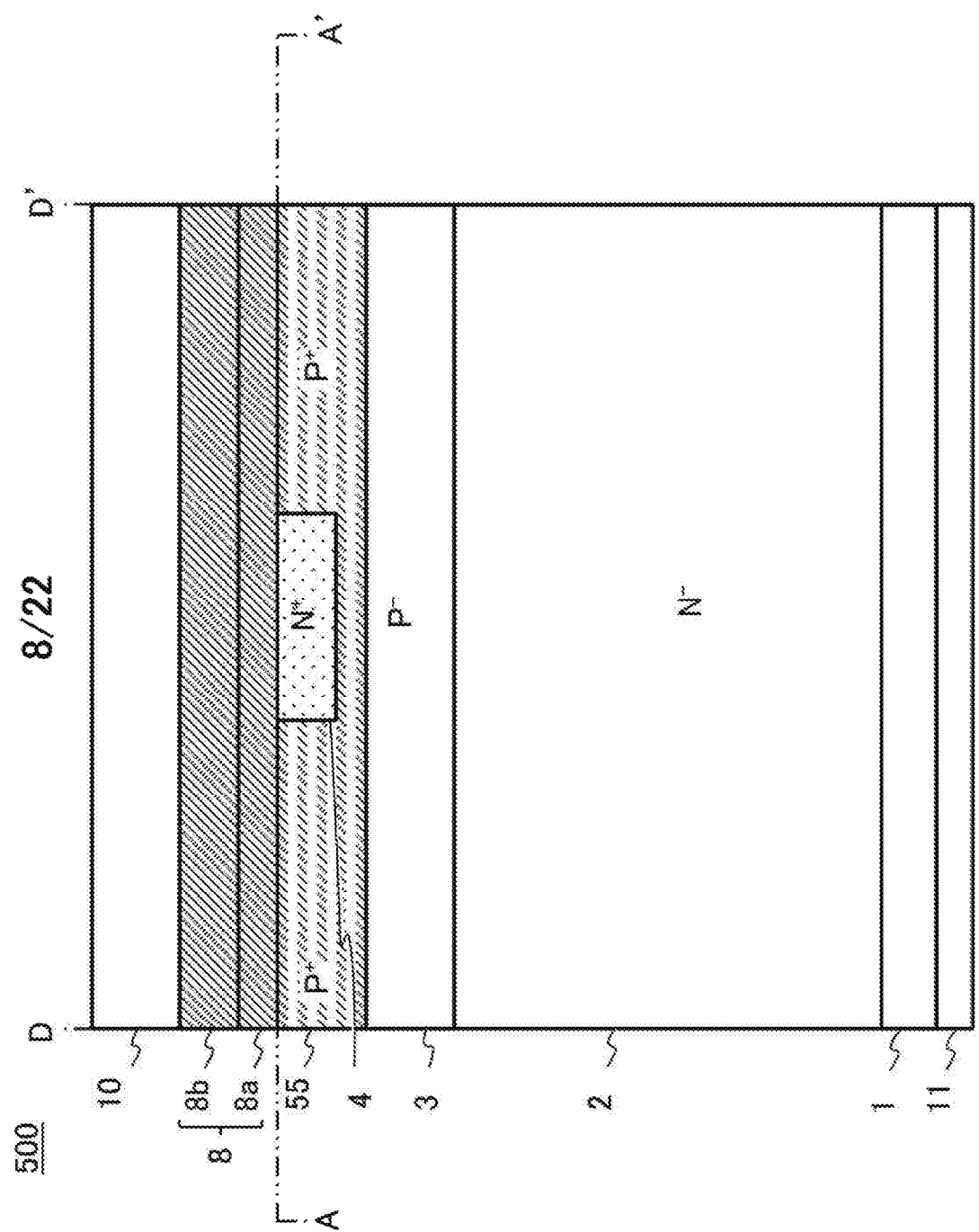
FIG. 2D shows an exemplary structure of the semiconductor device 500 along a D-D' cross-section thereof.

FIGS. 2A to 2D show an exemplary structure of a semiconductor device 500 relating to a first comparative example. FIG. 2A is a plan view showing as an example the structure of the semiconductor device 500. FIG. 2B shows an exemplary cross-sectional structure of the semiconductor device 500 along a B-B' cross-section thereof. FIG. 2C shows an exemplary cross-sectional structure of the semiconductor device 500 along a C-C' cross-section thereof. FIG. 2D shows an exemplary cross-sectional structure of the semiconductor device 500 along a D-D' cross-section thereof. The semiconductor device 500 relating to the first comparative example includes a $p^+$-type contact region 55. The semiconductor device 500 of the present example is differently structured than the semiconductor device 100 in that the trench spacer region 12 is not included. The remaining components of the semiconductor device 500 are represented by the same reference numerals as the corresponding components of the semiconductor device 100 and have the same configurations. In the present example, the pitch of the trench gates 7 is 2.4 µm to 5.0 µm.

In the first comparative example, the $p^+$-type contact region 55, which exhibits a higher concentration than the p-type base region 3, is in contact with the side wall of the trench. The $p^+$-type contact region 55 is a p-type semiconductor region having a high concentration and is not spaced away from the trench gate 7. In addition, the $p^+$-type contact region 55 is formed in the regions in which both the p-type base region 3 and the $n^+$-type source region 4 are formed. The $p^+$-type contact region 55 is formed in the same region as the $n^+$-type source region 4 in plan view, but largely protrudes toward the back surface of the semiconductor device 100 from the $n^+$-type source region 4. As the diffusion for the $p^+$-type contact region 55 largely protrudes toward the collector electrode 11, the diffusion also proceeds in the horizontal direction. As a result, the $p^+$-type contact region 55 comes into contact with the trench gate 7. Here, the threshold of the gate electrode is determined by the highest concentration of the p-type layer on the side wall of the trench. For this reason, the gate threshold is higher in the present example than the gate threshold determined by the p-type base region 3.

According to the first comparative example, the $p^+$-type contact region 55 and the $n^+$-type source region 4 are simultaneously formed by diffusion. Therefore, the diffusion depth of the $p^+$-type contact region 55 cannot be sufficiently controlled. In other words, it is difficult to control the diffusion for the $p^+$-type contact region 55 in such a manner that the trench spacer region 12 is spaced away from the trench gate 7 in the first embodiment. Accordingly, as microfabrication advances in the semiconductor device 500, the $p^+$-type contact region 55 expands in the trench width direction. The expansion of the $p^+$-type contact region 55 in the trench width direction increases the channel resistance. This inevitably results in the rise in the threshold voltage Vth and the drop in the change rate gfs of the collector current relative to the change in the gate voltage.

As described above, in the semiconductor device 500 relating to the first comparative example, the $n^+$-type source region 4 is surrounded by the $p^+$-type contact region 55 in the contact opening region 9. Accordingly, the semiconductor device 500 relating to the first comparative example cannot prevent the rise in the threshold voltage Vth and the drop in the parameter gfs, which accompany the microfabrication.

Second Comparative Example

Figure 3A:
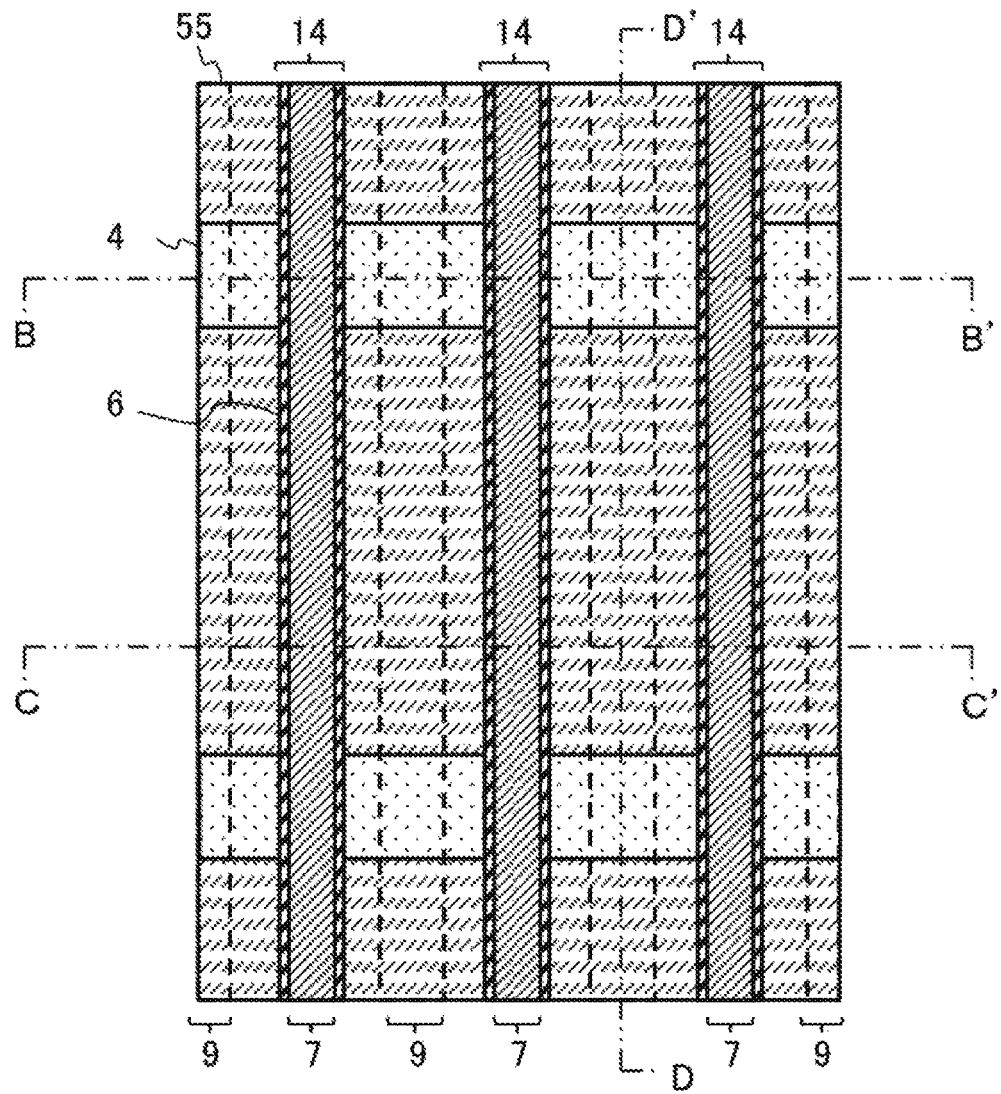
FIG. 3A is a plan view showing as an example of a semiconductor device 500 along a A-A' cross-section thereof.
Figure 3B:
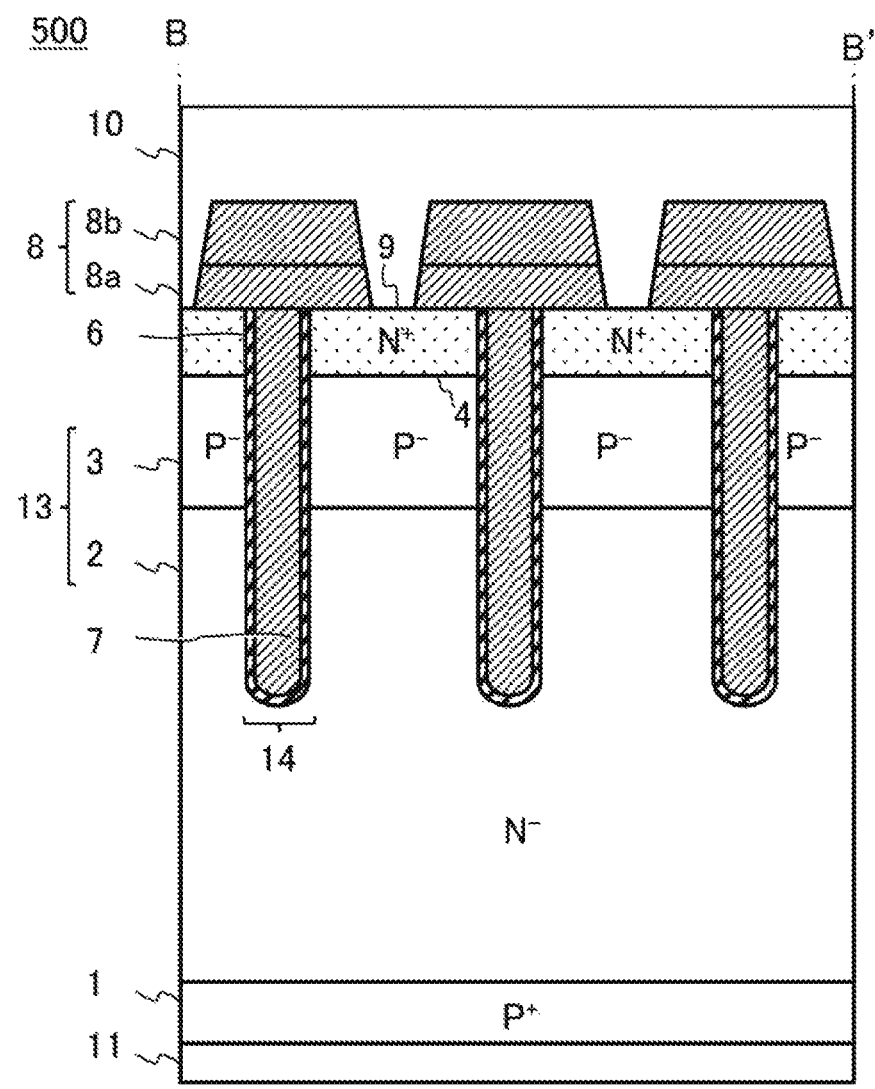
FIG. 3B shows an exemplary structure of the semiconductor device 500 along a B-B' cross-section thereof.
Figure 3C:
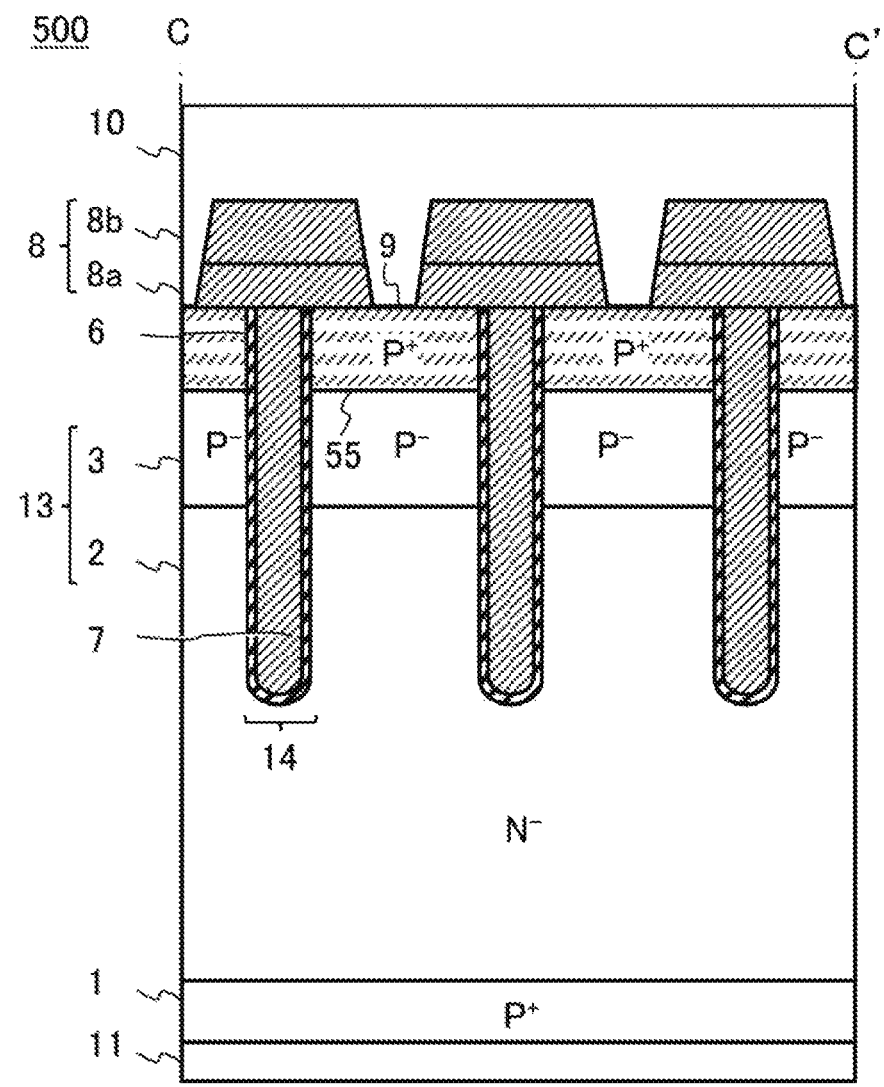
FIG. 3C shows an exemplary structure of the semiconductor device 500 along a C-C' cross-section thereof.
Figure 3D:
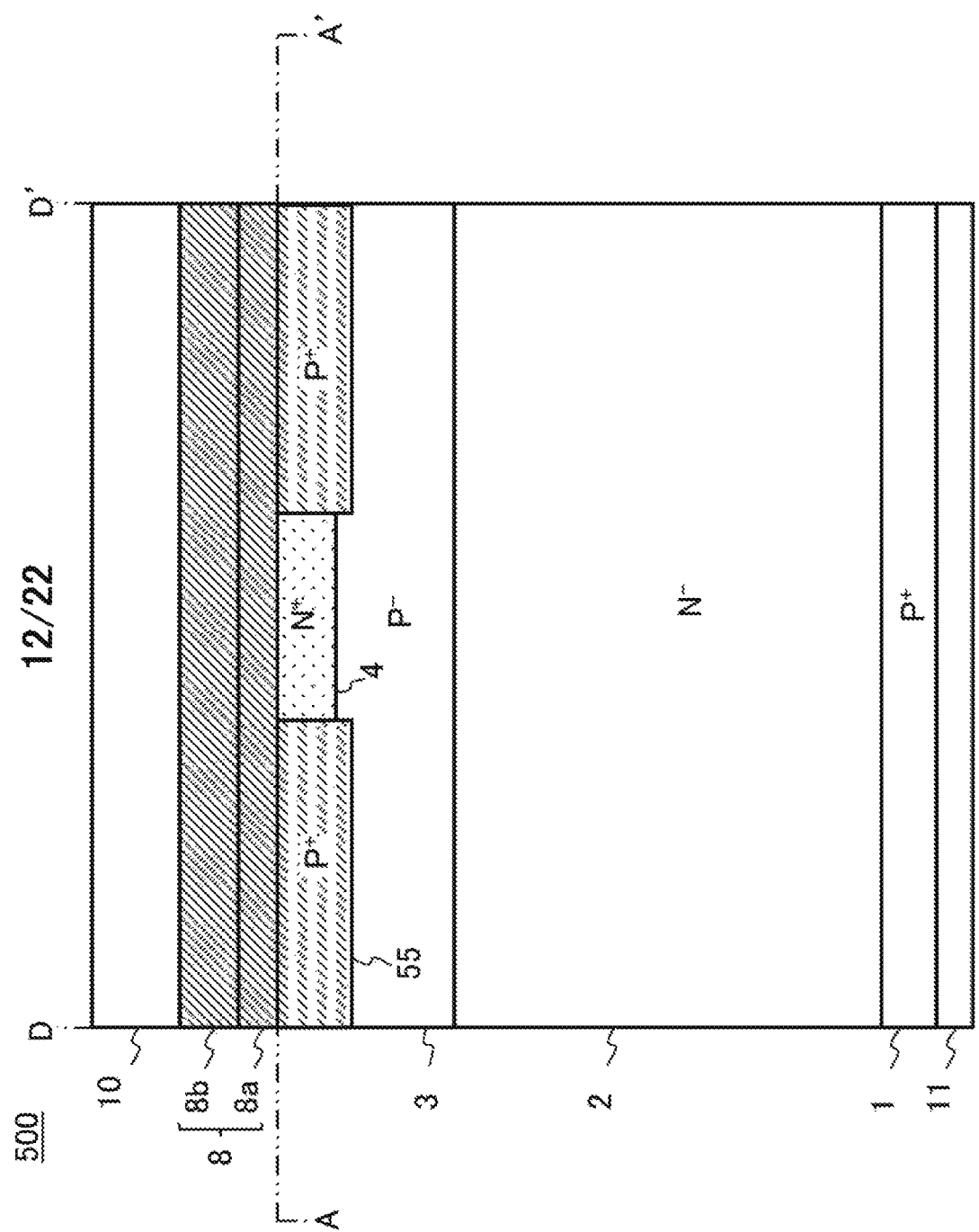
FIG. 3D shows an exemplary structure of the semiconductor device 500 along a D-D' cross-section thereof.

FIGS. 3A to 3D show an exemplary structure of the semiconductor device 500 relating to a second comparative example. FIG. 3A is a plan view showing as an example the structure of the semiconductor device 500. FIG. 3B shows an exemplary cross-sectional structure of the semiconductor device 500 along a B-B' cross-section thereof. FIG. 3C shows an exemplary cross-sectional structure of the semiconductor device 500 along a C-C' cross-section thereof. FIG. 3D shows an exemplary cross-sectional structure of the semiconductor device 500 along a D-D' cross-section thereof. The semiconductor device 500 relating to the present example is differently structured from the semiconductor device 100 in that the contact diffusion region 5a is not provided. The remaining components of the semiconductor device 500 are represented by the same reference numerals as the corresponding components of the semiconductor device 100 and have the same configurations. In the present example, the pitch of the trench gates 7 is within the range of 2.4 µm to 5.0 µm.

The semiconductor device 500 does not include the contact diffusion region 5a in the region in which the $n^+$-type source region 4 is formed. Specifically speaking, in the semiconductor device 500 relating to the second comparative example, the microfabrication is less likely to cause the $p^+$-type contact region 55 to expand in the trench width direction, when compared with the semiconductor device 500 relating to the first comparative example. Accordingly, the semiconductor device 500 relating to the second comparative example does not experience the rise in the threshold voltage Vth, which is caused by the expansion of the $p^+$-type contact region 55 in the trench width direction. The semiconductor device 500, however, cannot accomplish sufficient RBSOA since the contact diffusion region 5a is not formed under the $n^+$-type source region 4. In addition, the varying mask patterns used for forming the $n^+$-type source region 4 and the p-type base region 3 cause the threshold voltage Vth to vary, which resultantly raises the collector-emitter saturated voltage VCE (sat).

Figure 4:
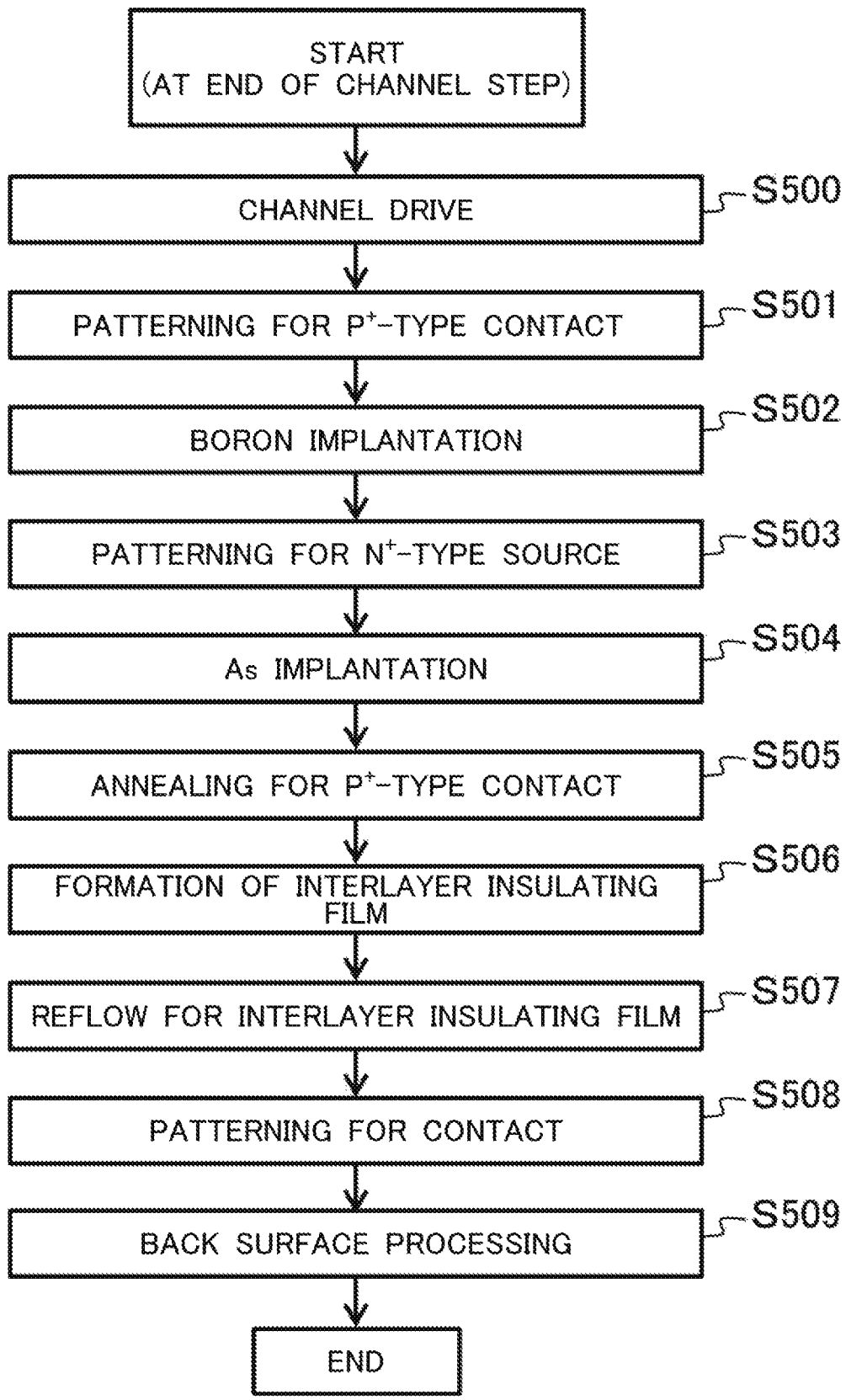
FIG. 4 shows an exemplary process of manufacturing a semiconductor device 500 relating to a first comparative example.

FIG. 4 shows an exemplary process of manufacturing the semiconductor device 500 relating to the first comparative example. The semiconductor device 500 is manufactured by performing the steps S500 to S509.

In the step S500, a channel is formed by a channel drive step. In the channel drive step, the semiconductor device 500 is subjected to annealing to cause diffusion in the channel region.

In the step S501, patterning is performed to form the $p^+$-type contact region 55. The patterning for the $p^+$-type contact region 55 forms a pattern in which an opening is formed as an ion implantation region and positioned above the $p^+$-type contact region 55. In the subsequent step S502, boron ions are implanted as p-type dopants into the $p^+$-type contact region 55.

In the step S503, patterning is performed to form the $n^+$-type source region 4. The patterning for the $n^+$-type source region 4 forms a pattern in which an opening is formed as an ion implantation region for the $n^+$-type source region 4. In the subsequent step S504, arsenic (As) ions are implanted into the $n^+$-type source region 4.

In the step S505, annealing is performed to cause thermal diffusion simultaneously in the $n^+$-type source region 4 and the $p^+$-type contact region 55. In the step S506, the interlayer insulating film 8 is formed. In the step S507, the interlayer insulating film 8 is subjected to reflow processing. In the step S508, patterning is performed to form the contact opening region 9, and the emitter electrode 10, which is made of Al—Si, is formed. In the step S509, back-surface processing is performed to grind the back surface of the semiconductor substrate 13 in order to reduce the thickness of the semiconductor substrate 13. The ground back surface of the semiconductor substrate 13 undergoes hydrogen ion implantation and activation to form an n-type field stop layer and boron ion implantation and activation in order to form the p-type collector layer 1. Finally, the collector electrode 11 is formed on the back surface of the p-type collector layer 1.

As described above, the $n^+$-type source region 4 and the $p^+$-type contact region 55 are simultaneously formed in the process of manufacturing the semiconductor device 500 relating to the first comparative example. This makes it very difficult to satisfactorily control the diffusion to form the $p^+$-type contact region 55. Accordingly, the semiconductor device 500 relating to the first comparative example cannot prevent the rise in the threshold voltage Vth and the drop in the parameter gfs, which accompany the microfabrication.

Figure 5:
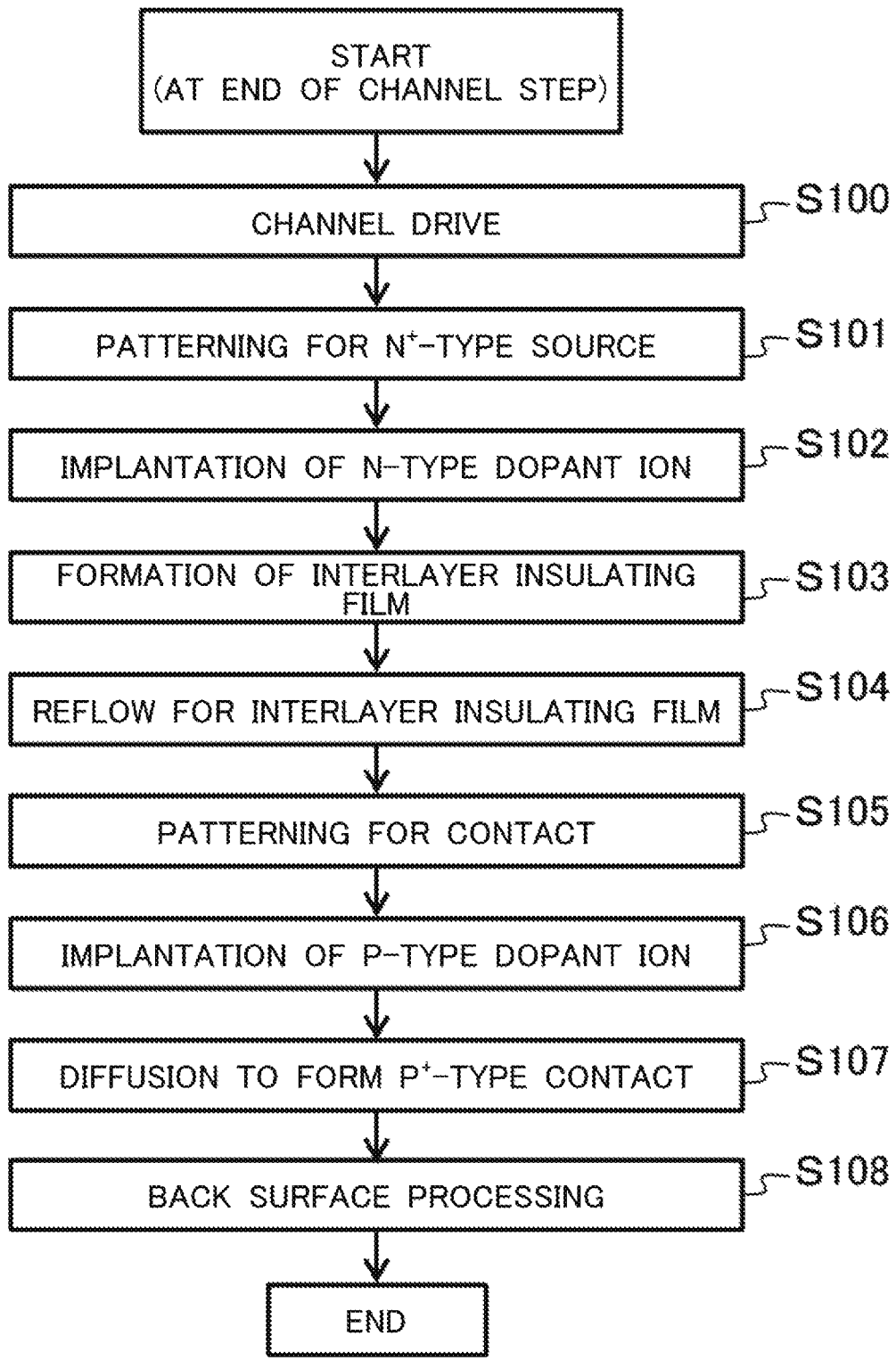
FIG. 5 shows an exemplary process of manufacturing a semiconductor device 100 relating to a first embodiment.

FIG. 5 shows an exemplary process of manufacturing the semiconductor device 100 relating to the first embodiment. The manufacturing process is the same as the process of manufacturing a common trench gate semiconductor structure up to the channel manufacturing step. The manufacturing process relating to the present example does not require the patterning for the $p^+$-type contact region.

In the channel drive step of step S100, the diffusion is only required to achieve a channel depth of 1.0 µm to 3.0 µm. In the drive step, the temperature may fall within the range of 1000° C. to 1150° C. In the $n^+$-type source region 4 patterning step of the step S101, a pattern is formed for the $n^+$-type source region 4 as in the step S503. In the n-type dopant ion implantation step of the step S102, n-type dopant ions are implanted into the $n^+$-type source region 4. The n-type dopants may include dopants commonly used for semiconductor processing such as arsenic (As) and phosphorus (P).

The interlayer insulating film 8 formation in the step S103 may be substantially the same as the step S506. Here, the interlayer insulating film 8 may be a dual layer structure in which different insulating films are stacked. For example, the first interlayer insulating film 8a is HTO and the second interlayer insulating film 8b is BPSG. The interlayer insulating film 8 reflow step of the step S104 may be substantially the same as the reflow step of the step S507. Note that, however, the reflow step of the step S104 causes the n-type dopant ions implanted in the step S102 to diffuse. The reflow step for BPSG is performed under such a condition that the temperature is within the range of 900° C. and 1000° C. In other words, the diffusion may be controlled to such an extent that the $n^+$-type source region 4 has a depth of 0.5 µm or less.

In the contact patterning step of the step S105, the contact opening region 9 is formed to implant ions to form the contact diffusion region 5a. The contact opening region 9 may be formed using a resist designed to form a contact. When the first interlayer insulating film 8a and the second interlayer insulating film 8b are utilized as a pattern to allow ions to be implanted to form the the contact diffusion region 5a, it is not necessary to separately perform the patterning for the contact opening region 9.

In the p-type dopant ion implantation step of the step S106, p-type dopant ions are implanted to form the contact diffusion region 5a in the contact opening region 9. In the present example, the ion implantation is performed with low dosage and low accelerating voltage. In this manner, the trench spacer embedded region 12a can be formed so as to slightly protrude from the $n^+$-type source region 4 toward the back surface of the semiconductor device 100. In the p-type dopant ion implantation step, boron (B) ions are implanted. For example, the p-type dopant ions are implanted through the first interlayer insulating film 8a and the second interlayer insulating film 8b. Alternatively, the p-type dopant ions may be implanted through a resist designed to form a contact.

In the step S107, the contact implantation region 5b is subjected to annealing to be formed into the contact diffusion region 5a. For example, the diffusion to form the contact diffusion region 5a may take place under such a condition that the temperature is set within the range of 800° C. and 950° C., for example, 900° C. in the case of boron. For example, the diffusion is controlled such that the contact diffusion region 5a outside the $n^+$-type source region 4 has a depth of within 0.2 µm from the $n^+$-type source region 4 and the contact diffusion region 5a within the $n^+$-type source region 4 has a depth of within 0.2 µm, which falls between the depth of the $n^+$-type source region 4 and the depth of the contact diffusion region 5a outside the $n^+$-type source region 4.

It should be noted that the conditions under which the diffusion takes place to form the trench spacer region 12 are changed as appropriate depending on the structure of the semiconductor device 100, the pitch of the trench gates 7 and the like. In the present example, the diffusion step for the $p^+$-type contact region takes place after the annealing step to cause the diffusion to form the n+-type source region 4 as in the manufacturing process relating to the second comparative example. Thus, according to the manufacturing method relating to the present example, the trench spacer region 12 can avoid being affected by the heat to anneal the $n^+$-type source region 4. This makes it possible to freely regulate the diffusion in the contact implantation region 5b.

In the subsequent step S108, the back surface of the semiconductor substrate 13 is ground in order to reduce the thickness of the semiconductor substrate 13. The ground back surface of the semiconductor substrate 13 undergoes either or both of hydrogen ion implantation and phosphorus ion implantation and activation to form an n-type field stop layer and boron ion implantation and activation in order to form the p-type collector layer 1. Finally, the collector electrode 11 is formed on the back surface of the p-type collector layer 1. Alternatively, the n-type field stop layer may be made of selenium. In this case, the back surface may be ground after the first interlayer insulating film 8a or the second interlayer insulating film 8b is formed, and selenium ions may be then implanted through the ground surface and diffused at a temperature of 800° C. to 950° C., for example, at a temperature of approximately 900° C. The conditions under which the diffusion takes place in the contact diffusion region 5a preferably include a temperature equal to or higher than the temperature at which selenium ions can diffuse.

As described above, according to the manufacturing method for the semiconductor device 100 relating to the first embodiment, the contact opening region 9 is used to perform the implantation for the contact diffusion region 5a. This eliminates the necessity of the mask for the contact diffusion region 5a. As a result, the manufacturing method of the present example can reduce the number of steps performed to manufacture the semiconductor device 100 relating to the first embodiment.

In addition, since the diffusion takes place for the contact diffusion region 5a after the n$^+$-type source region 4 is formed, the size of the contact diffusion region 5a can be controlled. In other words, it is possible to control the diffusion such that the trench spacer region 12 is spaced away from the trench gate 7. Accordingly, even if microfabrication advances in the semiconductor device 100, the contact diffusion region 5a does not expand in the trench width direction. As a consequence, the semiconductor device 100 can reduce the rise in the threshold voltage Vth and the drop in the parameter gfs.

Figure 6:
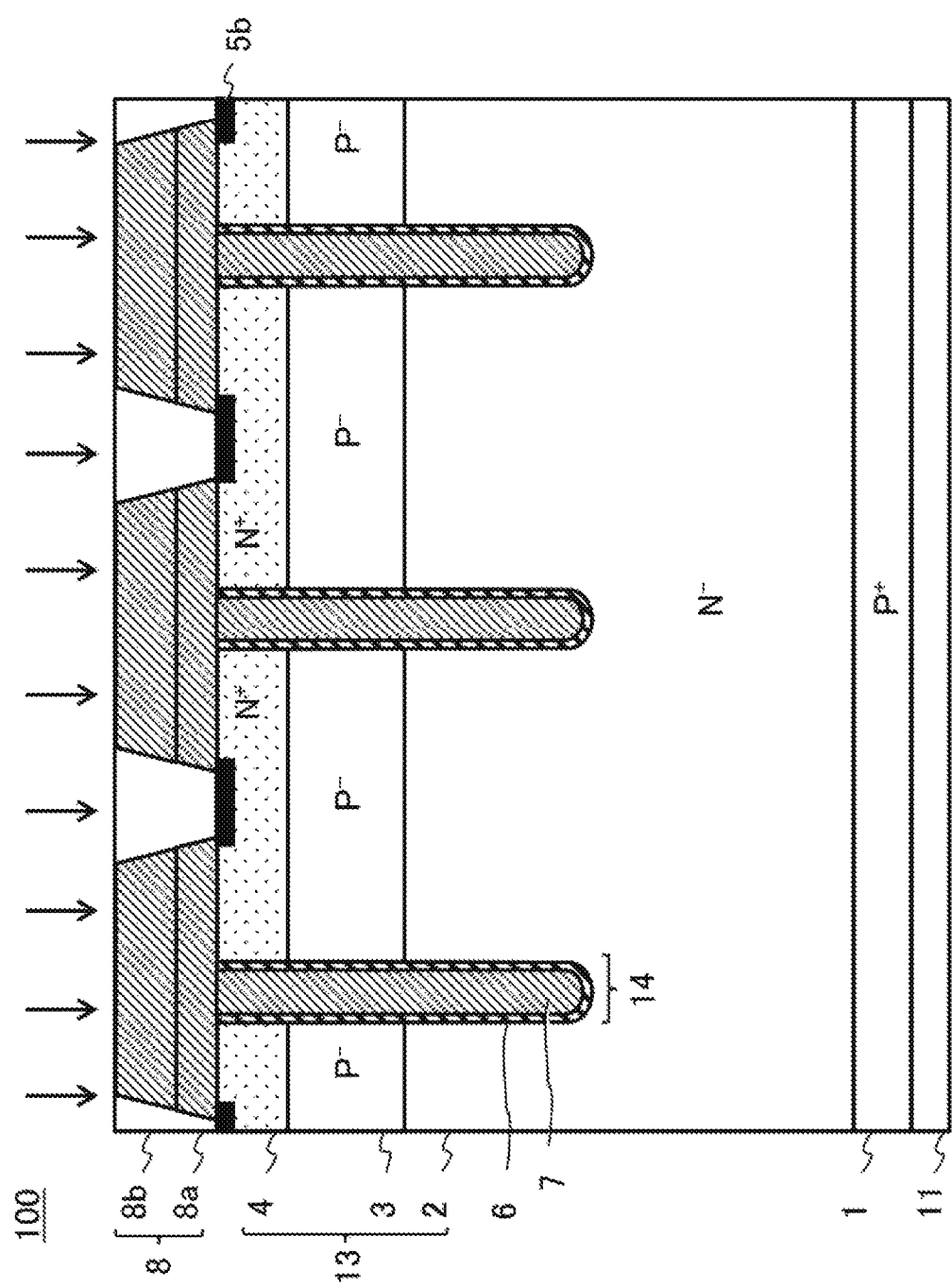
FIG. 6 shows an example of a diffusion step for a contact implantation region 5b.

FIG. 6 shows an example of the diffusion step for the contact implantation region 5b. The contact implantation region 5b is formed by performing ion implantation on the surface of the n$^+$-type source region 4 at low dosage and low accelerating voltage. As a result of the diffusion, the contact implantation region 5b is formed into the contact diffusion region 5a shown in FIG. 1B. For example, when boron is implanted to form the contact implantation region 5b, the accelerating voltage may be within the range of no less than 40 KeV and no more than 150 KeV, no less than 40 KeV and no more than 100 KeV, or no less than 40 KeV and no more than 80 KeV. When boron is implanted, the accelerating voltage preferably falls within the range of no less than 40 KeV and no more than 60 KeV. When the contact implantation region 5b is formed, boron is implanted at a dosage of, for example, 1e15 cm$^{-2}$ to 3e15 cm$^{-2}$, preferably equal to approximately one fifth of the As dosage.

The conditions under which the ion implantation is performed may be adjusted depending on the structure of the semiconductor device 100. For example, as the center of the n$^+$-type source region 4 becomes shallower, the position of the contact implantation region 5b is made shallower. In this manner, the contact diffusion region 5a can be prevented from diffusing to come into contact with the trench gate 7. Here, as a result of the diffusion of the contact implantation region 5b, the impurity concentration in a portion of the n$^+$-type source region 4 that is positioned within the contact opening region 9 in plan view may be lower than the impurity concentration of a portion of the n$^+$-type source region 4 that abuts the trench gate 7.

Second Embodiment

Figure 7:
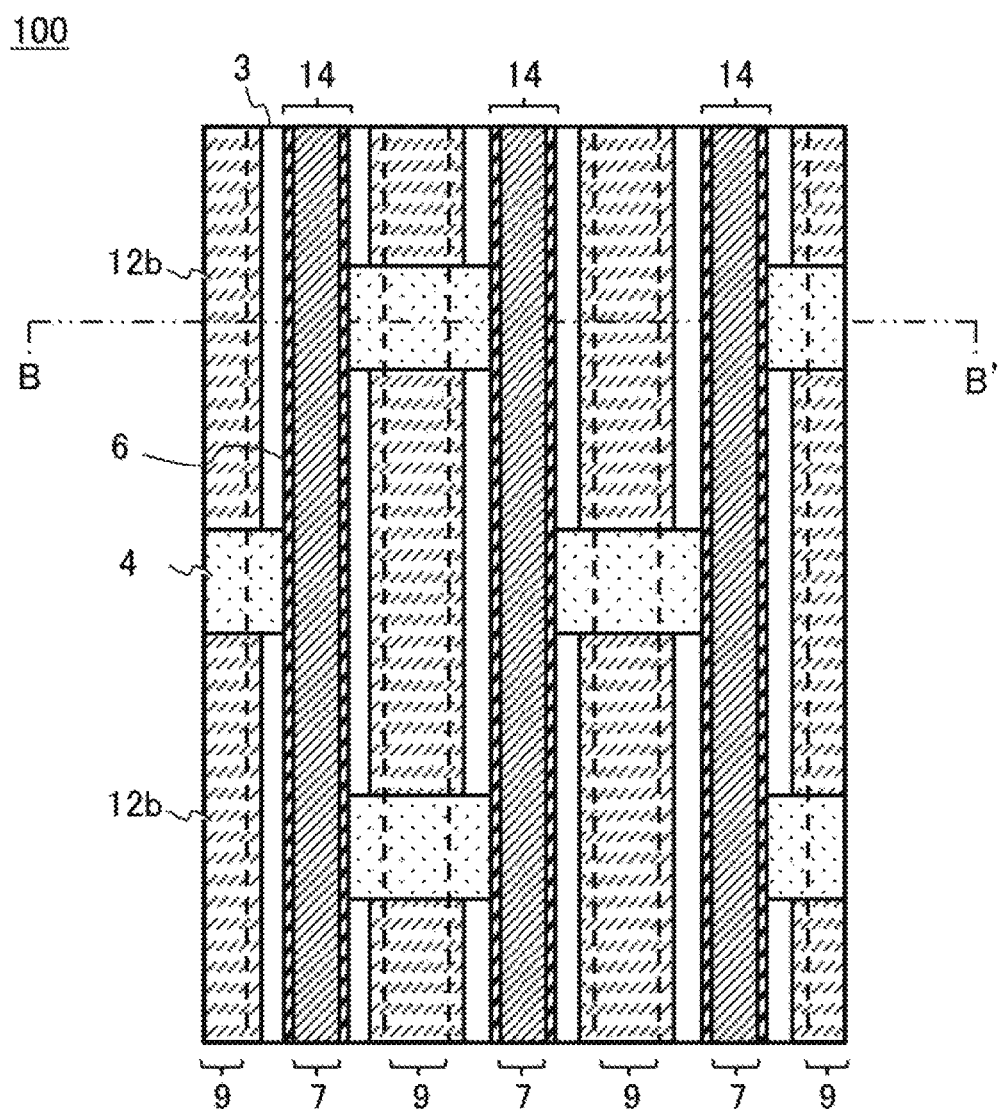
FIG. 7 is a plan view showing as an example a semiconductor device 100 relating to a second embodiment.

FIG. 7 is a plan view showing as an example a semiconductor device 100 relating to a second embodiment. In the semiconductor device 100 relating to the present example, the n$^+$-type source regions 4 are arranged in a checkerboard pattern in plan view. In other words, in the trench width direction, the n$^+$-type source regions 4 and the trench spacer surface regions 12b alternate with each other with the trenches 14 placed therebetween. In the trench depth direction, the intervals between the n$^+$-type source regions 4 may be equal to the intervals between the trench spacer surface regions 12b. In the semiconductor device 100 relating to the second embodiment, the n$^+$-type source regions 4 and the trench spacer surface regions 12b are more evenly distributed within the active plane than in the semiconductor device 100 relating to the first embodiment. In this way, the semiconductor device 100 relating to the second embodiment can achieve further decreased on-voltage.

Figure 8:
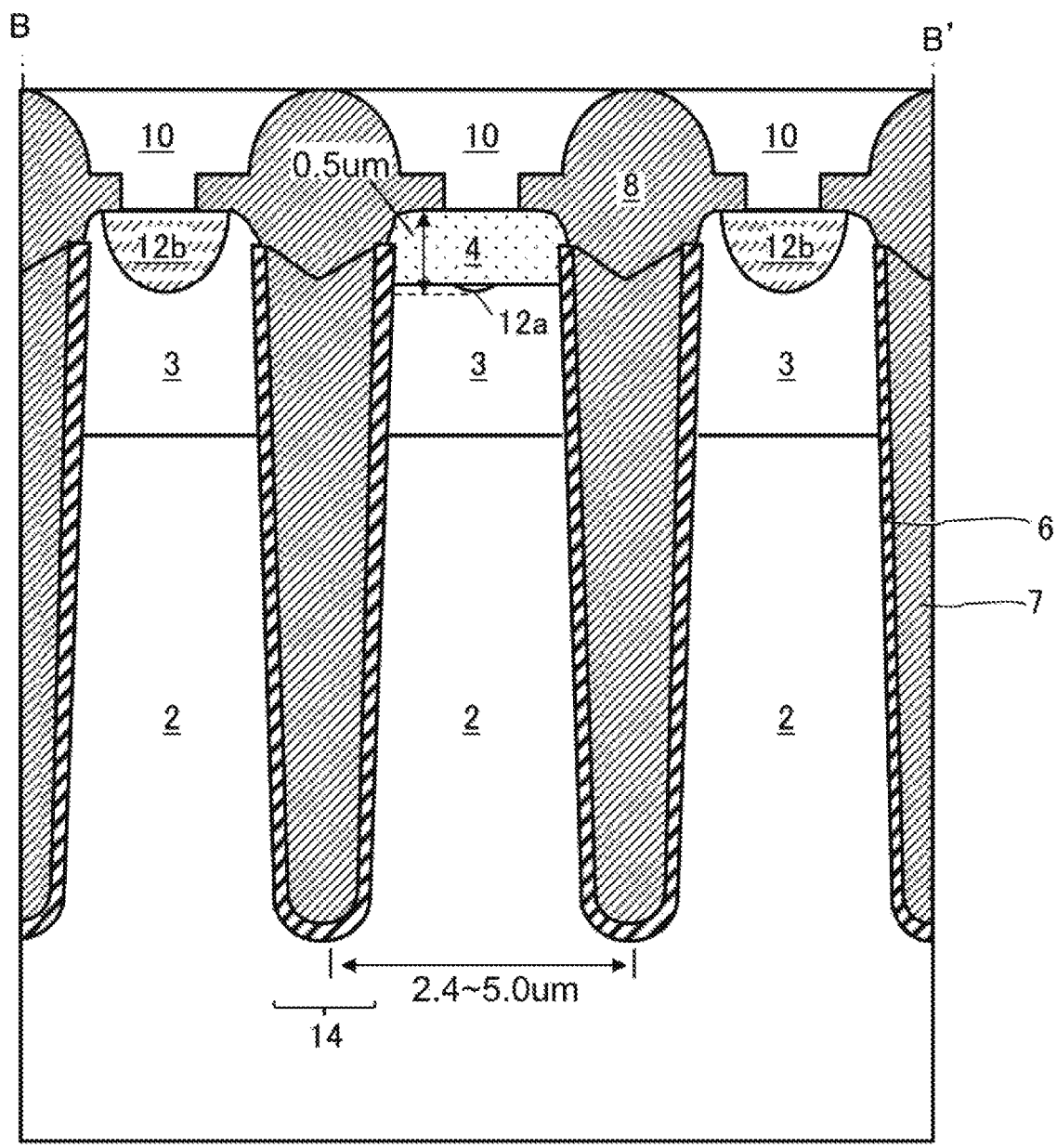
FIG. 8 shows the semiconductor device 100 relating to the second embodiment along a B-B' cross-section thereof.

FIG. 8 is a schematic view showing the semiconductor device 100 relating to the second embodiment along a B-B' cross-section thereof. Such a cross-section can be observed by using, for example, scanning capacitance microscopy (SCM), scanning microwave microscope (SMM) and the like. SCM images make it possible to observe semiconductor carrier concentration distribution. For example, the depth of the p-type base region 3 is approximately 1.0 to 3.0 μm, and the depth of the trench spacer embedded region 12a is 0.5 μm or less. The thickness of the trench spacer embedded region 12a in the depth direction may be within 0.2 μm. In addition, the pitch of the trench gates 7 may be approximately 2.4 μm to 5.0 μm.

The bottom surface of the trench spacer embedded region 12a may be deeper than the deepest portion of the upper surface of the trench gate 7 (the surface of the trench gate 7 in contact with the interlayer insulating film 8). With such a configuration, the holes under the n$^+$-type source region 4 are likely to concentrate in the trench spacer embedded region 12a and can flow into the emitter electrode 10 through the trench spacer surface region 12b and the contact opening region 9. In this way, the holes, which tend to be attracted to the electrons due to the coulomb force, can be separated from the n$^+$-type source region 4. This can contribute to improve the latch-up immunity.

Figure 9:
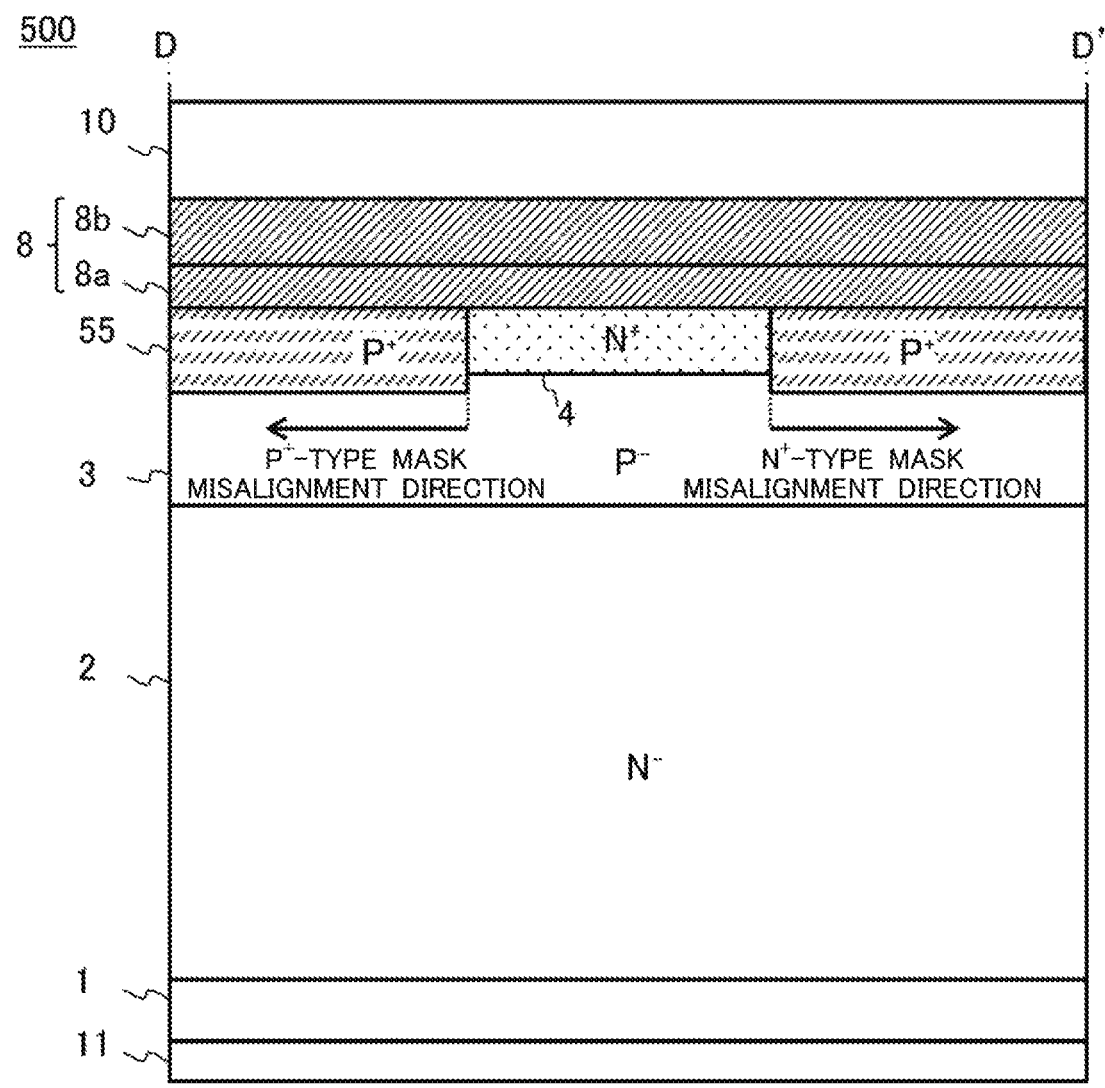
FIG. 9 shows a semiconductor device 500 relating to a second comparative example along a D-D' cross-section thereof.

FIG. 9 shows a semiconductor device 500 relating to a second comparative example along a D-D' cross-section thereof. The semiconductor device 500 of the present example experiences mask misalignment in the trench depth direction. Misalignment of one of the mask for the n$^+$-type source region 4 and the mask for the p$^+$-type contact region 55 is enough to introduce misaligned arrangements in the semiconductor device 500. In the present example, the masks can be misaligned in such a direction that the n$^+$-type source region 4 has a larger width than designed in the trench depth direction. If the n$^+$-type source region 4 has a large width in the trench depth direction as described above, the holes are likely to be accumulated on the back surface side of the n$^+$-type source region 4, which resultantly reduces the RBSOA. In addition, if the n$^+$-type source region 4 has a larger width than designed in the trench depth direction, the channel density increases. This increases the saturation current Isat and reduces the short circuit safe operating area (SCSOA) of the semiconductor device 500.

Figure 10:
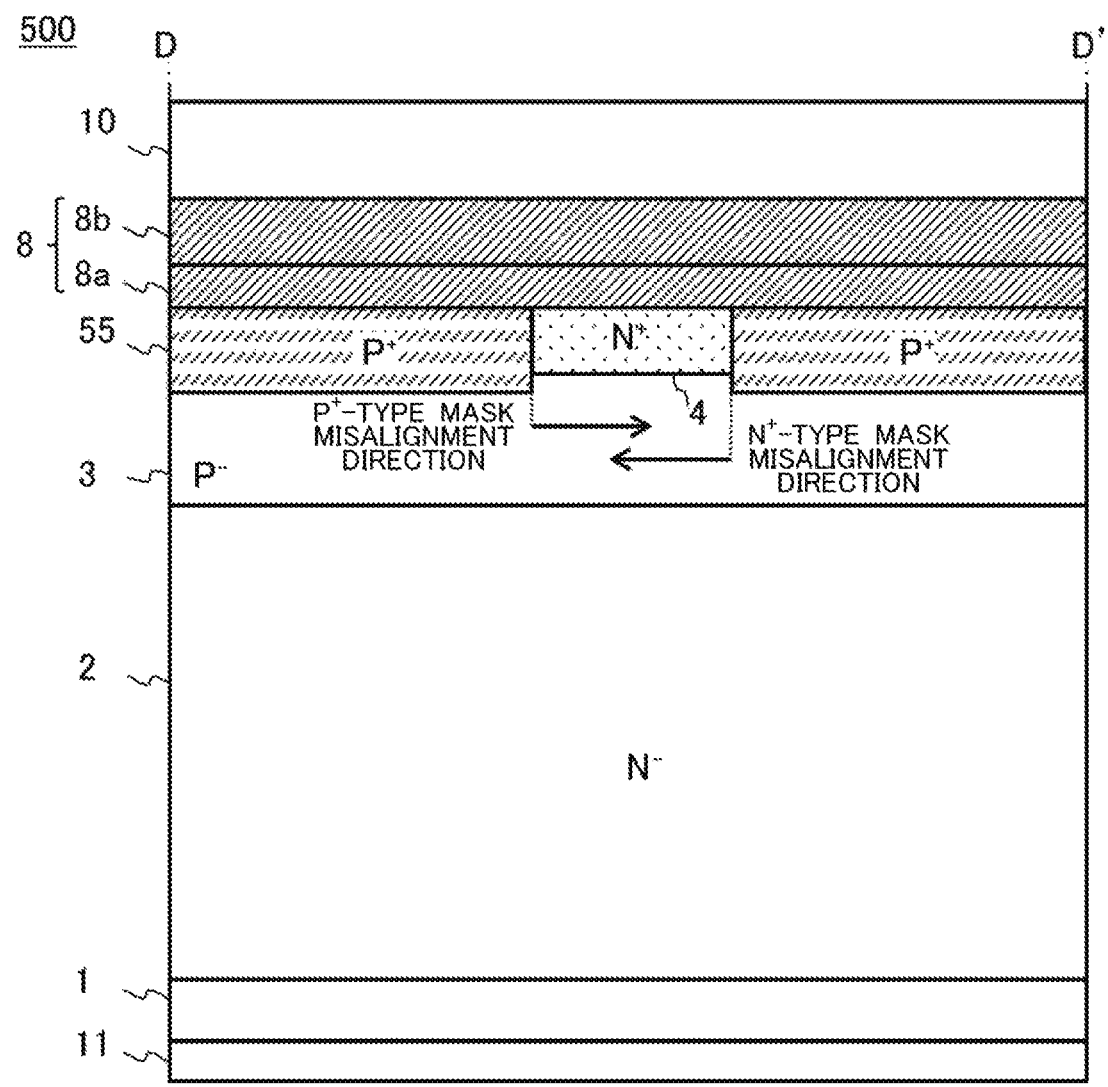
FIG. 10 shows the semiconductor device 500 relating to the second comparative example along a D-D' cross-section thereof.

FIG. 10 shows the semiconductor device 500 relating to the second comparative example along a D-D' cross-section thereof. In the present example, the mask is misaligned in such a direction that the n$^+$-type source region 4 has a smaller width than designed in the trench depth direction. If the width of the n$^+$-type source region 4 decreases in the trench depth direction as noted above, the channel density drops and the saturation current Isat accordingly decreases. In addition, if the n$^+$-type source region 4 has a smaller width than designed in the trench depth direction, the p$^+$-type contact region 55 diffuses into the n$^+$-type source region 4 and the n$^+$-type source region 4 resultantly exhibits an increased contact resistance. Accordingly, if the n$^+$-type source region 4 has a smaller width than designed in the trench depth direction in the semiconductor device 500, the threshold voltage Vth changes and VCE(sat) increases.

Figure 11:
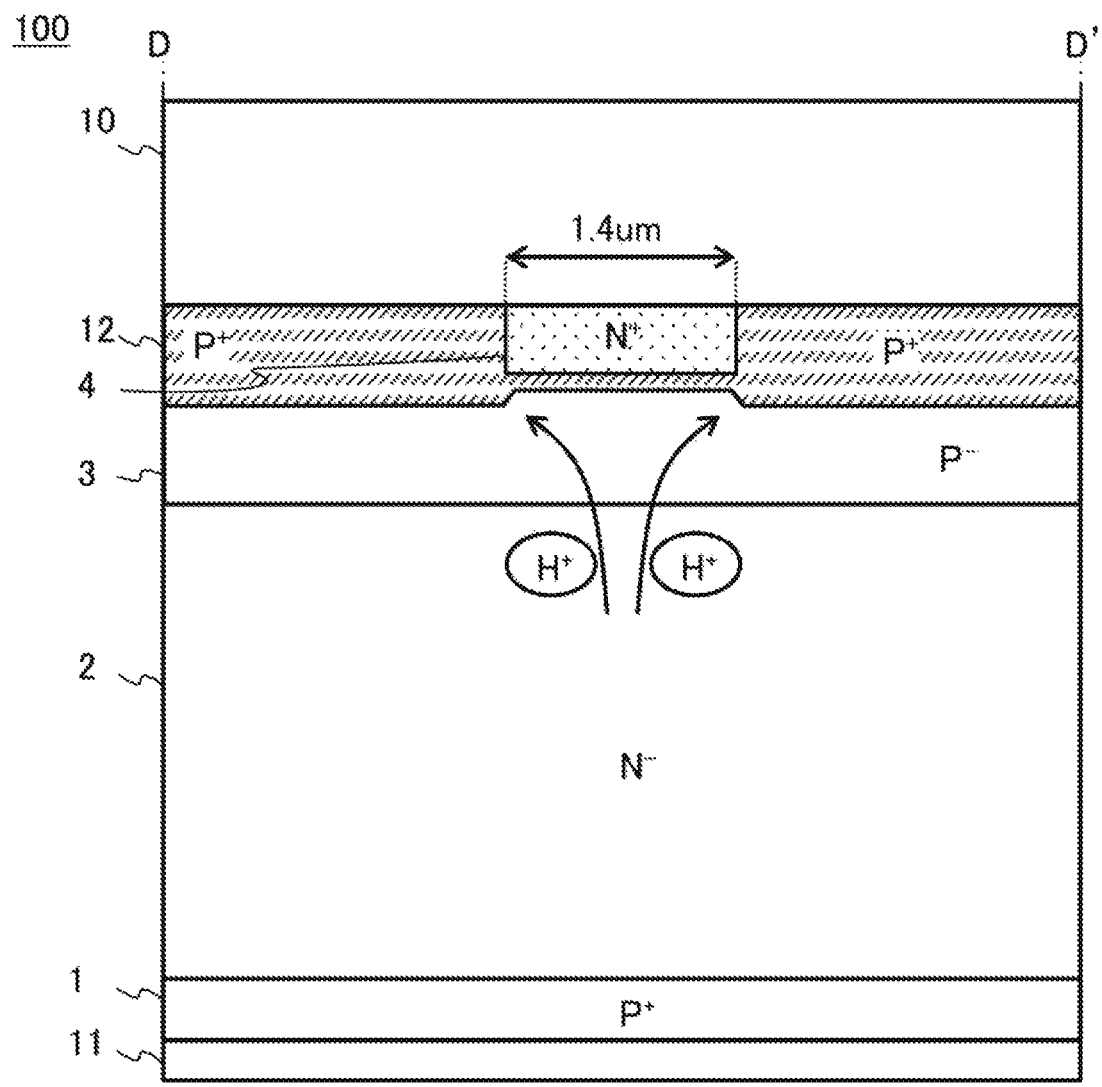
FIG. 11 shows the semiconductor device 100 relating to the first embodiment along a D-D' cross-section thereof.

FIG. 11 shows the semiconductor device 100 relating to the first embodiment along the D-D' cross-section thereof. In the present example, the n$^+$-type source region 4 has a length of 1.4 μm in the trench depth direction. In FIG. 11, the label "H$^+$" denotes the holes.

As for the semiconductor device 100, a contact mask is used to implant p-type dopant ions into the n$^+$-type source region 4. In addition, the implantation to form the trench spacer region 12 impinges on the center of the n$^+$-type source region 4. Therefore, the semiconductor device 100 avoids mask misalignment in the trench depth direction, which can also avoid variability in the trench depth direction for the n⁺-type source region 4. Only a contact mask is used which may be patterned to extend in the trench depth direction. Such a contact mask may cause variability in the trench width direction. The n⁺-type source regions 4 may have variability in the trench depth direction, but the trench spacer surface regions 12b are not affected by the variability in the trench depth direction but by the variability in the trench width direction. For these reasons, the characteristics of the n⁺-type source region 4 have little influence, and mask-induced variability can be reduced.

When the trench spacer embedded region 12a is positioned at a shallow depth, this disadvantageously causes the drop in the RBSOA. To address this issue, the width of the n⁺-type source region 4 in the trench depth direction is regulated to be 1.4 μm or less in the semiconductor device 100. In this way, while the semiconductor device 100 is turned off, the holes can be attracted not only to the trench spacer embedded region 12a but also to the adjacent trench spacer surface region 12b. Accordingly, the semiconductor device 100 can achieve satisfactory RBSOA even if the trench spacer embedded region 12a is positioned at a shallow depth.

Figure 12:
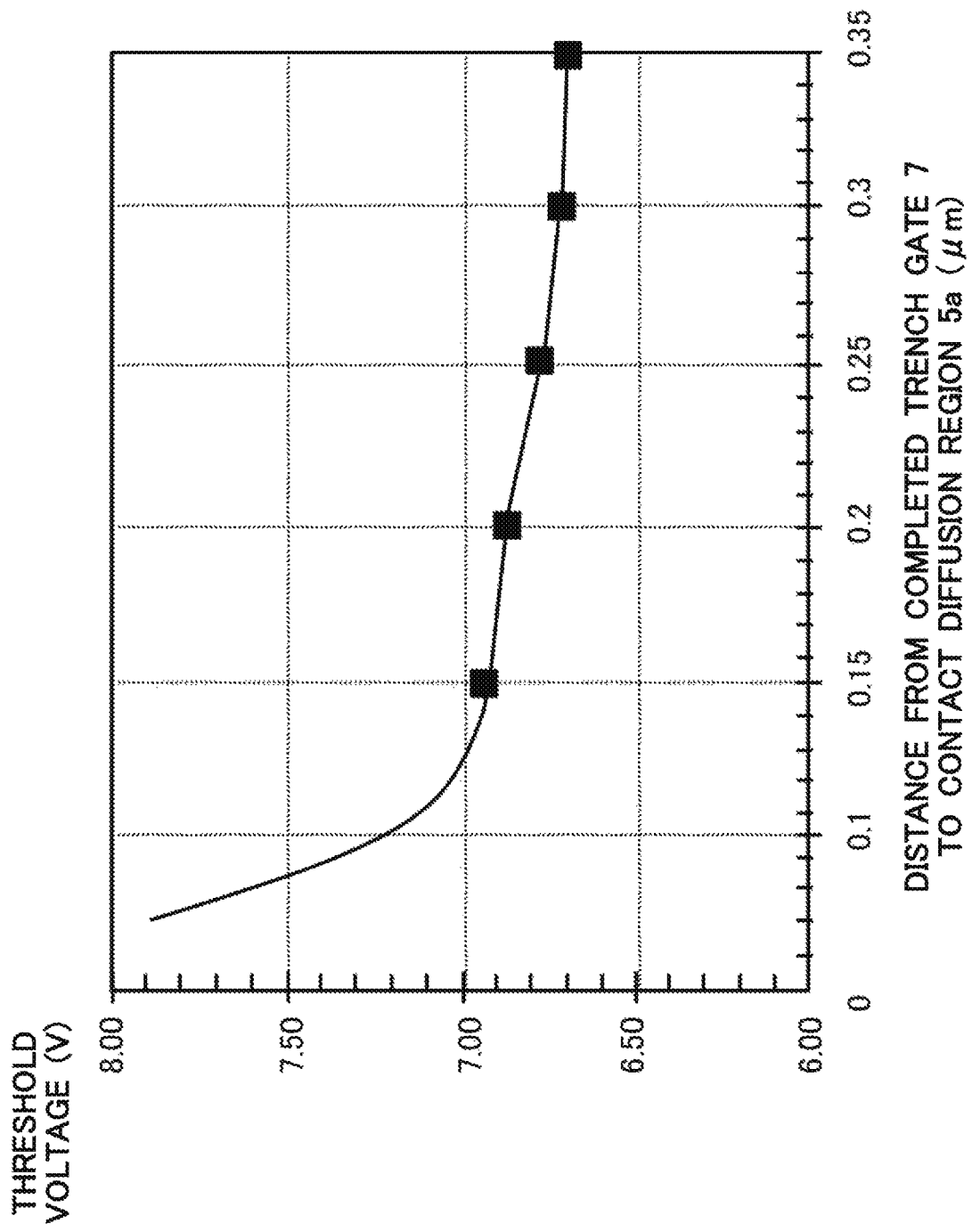
FIG. 12 shows how a threshold voltage Vth varies in relation to the width of a contact.

FIG. 12 shows how the threshold voltage Vth varies in relation to the distance from the completed trench gate 7 to the contact diffusion region 5a. The variability in the threshold voltage Vth was calculated based on the results of the experiments in which the distance from the completed trench gate 7 to the contact diffusion region 5a is decremented by 0.05 μm. In FIG. 12, the horizontal axis represents the distance (μm) from the completed trench gate 7 to the contact diffusion region 5a and the vertical axis represents the threshold voltage Vth (V). Here, the contact width is defined as the width of the contact opening region 9 in the trench width direction.

The rise in the threshold voltage Vth can be prevented even if the distance from the completed trench gate 7 to the contact diffusion region 5a is set to 0.3 μm. The rise in the threshold voltage Vth can be as small as 0.2 V even if the distance from the completed trench gate 7 to the contact diffusion region 5a is set as small as 0.3 μm to 0.15 μm. Accordingly, provided that the distance from the completed trench gate 7 to the contact diffusion region 5a is 0.3 μm or more, the variation in the threshold voltage Vth can be minimized even if the processing may introduce the variation in the contact width.

In addition, when the distance from the trench gate 7 to the contact diffusion region 5a is 0.15 μm or more, the rise in the threshold voltage Vth can be as small as approximately 3%. Therefore, the distance can be set to 0.15 μm or more. If the distance is shorter than 0.15 μm, the threshold voltage increases by more than 10%, for example. Meanwhile, when the distance from the trench gate 7 to the contact diffusion region 5a is larger than 1 μm, the injection enhanced (IE) effects are weakened and the on-voltage increases. Therefore, the distance is preferably equal to or less than 1 μm.

As is apparent from the above, even if microfabrication advances to reduce the pitch of the trench gates 7 to 5 μm or less, for example, approximately 2.4 μm, the influence of the processing variability on the characteristics of the semiconductor device 100 can be reduced. In addition, the pitch of the trench gates 7 can be 2.4 μm or less if the device is accurately manufactured according to the design, for example, the processing variability is reduced to 0.05 μm or less, or if the contact width is reduced to 0.5 μm or less. Even in this case, the distance from the trench gate 7 to the contact diffusion region 5a may be within the range of no less than 0.15 μm to no more than 1 μm.

Figure 13:
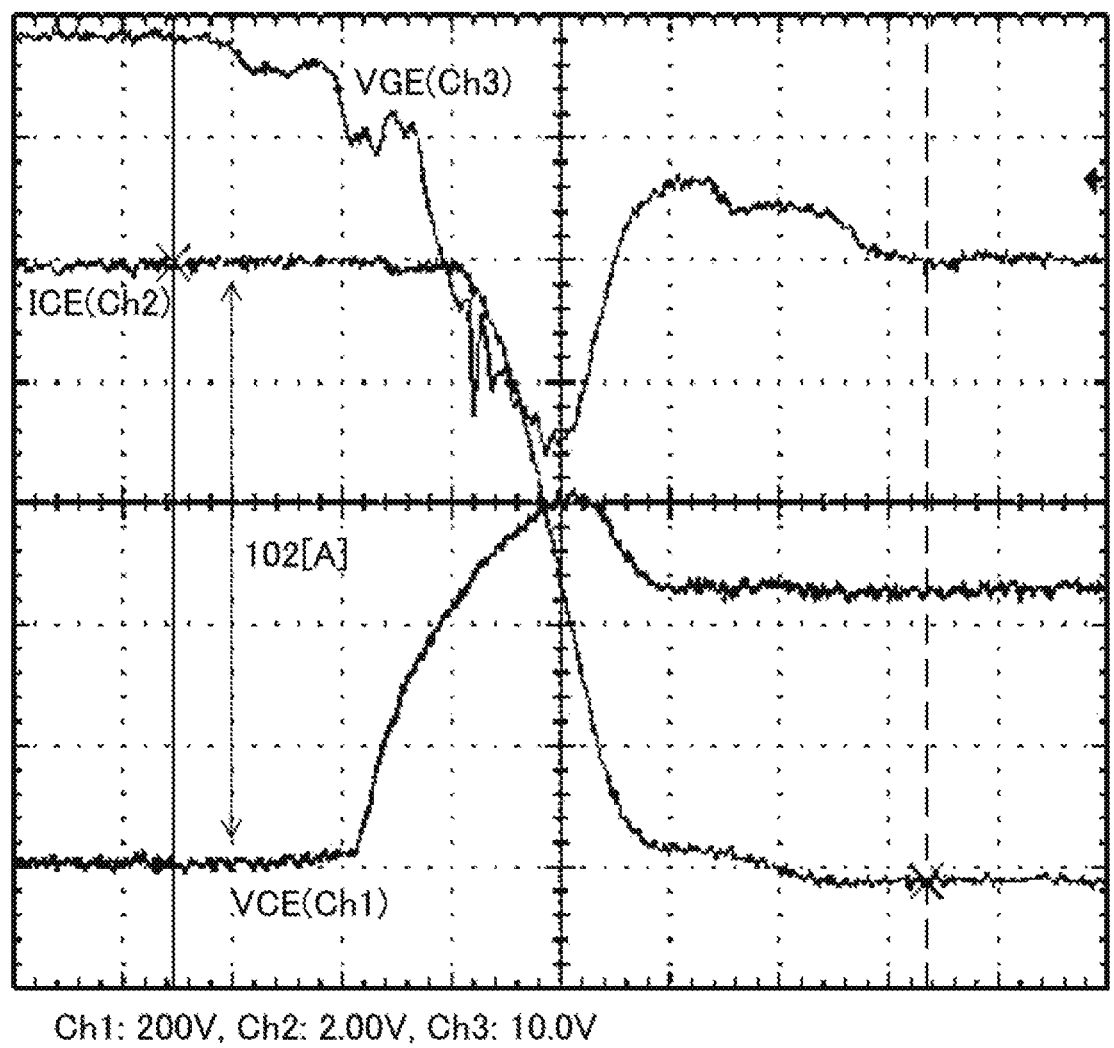
FIG. 13 shows the results of the RBSOA measurements for the semiconductor device 100.

FIG. 13 shows the results of the RBSOA measurements for the semiconductor device 100. In the present example, the RBSOA is measured under such conditions that the collector-emitter voltage VCE=475 V, the gate-emitter voltage VGE=15 V, the gate off resistance Rgoff=18 ohm, L=50 uH, and the temperature Tc=150° C. In the present example, an element with a rated current of 10 A is used.

Since the width of the n⁺-type source region 4 is as short as 1.4 μm or less in the trench gate 7 depth direction in the semiconductor device 100, the holes flow through the n⁺-type source region 4 into the adjacent trench spacer embedded region 12a. The holes are even more likely to be attracted since boron ions are diffused in the trench spacer embedded region 12a and additionally under the n⁺-type source region 4. For the reasons stated above, the semiconductor device 100 can avoid breaking down even if it is supplied with the current that is 10 times as large as the rated current, for example, and can achieve 10 times or more higher RBSOA, if the n⁺-type source region 4 has a width of 1.4 μm or less in the trench depth direction and the trench spacer embedded region 12a is formed.

Since the trench spacer region 12 is formed by diffusion after the n⁺-type source region 4 is formed by diffusion as discussed above, the semiconductor device 100 can prevent the trench spacer region 12 from being affected by heat. Accordingly, the trench spacer embedded region 12a can be formed. In addition, since the contact implantation region 5b is formed by ion implantation using the contact opening region 9, it is no longer necessary to fabricate the mask for the contact implantation region 5b and the manufacturing steps are thus reduced in number.

The semiconductor device 100 can prevent the rise in the threshold voltage Vth and the drop in the parameter gfs even if microfabrication advances to reduce the pitch of the trench gates 7 to 5 μm or less. However much the microfabrication advances in the semiconductor device 100, the expansion of the p⁺-type dopants in the trench width direction do not cause the rise in the threshold voltage Vth and the drop in the parameter gfs to a problematic extent since the trench spacer region 12 is spaced away from the trench gate 7. In addition, the semiconductor device 100 can achieve improved RBSOA by reducing the width of the n⁺-type source region 4 in the trench depth direction. As a consequence, the pitch of the trench gates 7 can be reduced and the VCE(sat) can be reduced due to the improved IE effects.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

DESCRIPTION OF REFERENCE NUMERALS

1 . . . p-type collector layer, 2 . . . drift layer, 3 . . . p-type base region, 4 . . . n$^+$-type source region, 5a . . . contact diffusion region, 5b . . . contact implantation region, 55 . . . p$^+$-type contact region, 6 . . . gate oxide film, 7 . . . trench gate, 8 . . . interlayer insulating film, 8a . . . first interlayer insulating film, 8b . . . second interlayer insulating film, 9 . . . contact opening region, 10 . . . emitter electrode, 11 . . . collector electrode, 12 . . . trench spacer region, 12a . . . trench spacer embedded region, 12b . . . trench spacer surface region, 13 . . . semiconductor substrate, 14 . . . trench, 100 . . . semiconductor device, 500 . . . semiconductor device

What is claimed is:

1. A manufacturing method for a semiconductor device including a trench gate extending in a first direction in plan view and a plurality of first-conductivity-type regions and a plurality of second-conductivity-type regions alternating with each other in the first direction, the manufacturing method comprising:
   forming the plurality of first-conductivity-type regions so as to be spaced away from each other in the first direction;
   implanting ions into the plurality of first-conductivity-type regions; and
   forming a second conductivity type trench spacer region so as to be spaced away from the trench gate, wherein
   the second conductivity type trench spacer region overlaps a given one of the plurality of first-conductivity-type regions in plan view and is positioned closer to a back surface of the semiconductor device than the given one of the plurality of first-conductivity-type regions is, wherein
   a maximum depth of the second conductivity type trench spacer region that overlaps a given one of the plurality of first-conductivity-type regions in plan view is shallower than a maximum depth of the second conductivity type trench spacer region that overlaps one of the plurality of second-conductivity-type regions adjacent to the given one of the plurality of first-conductivity-type regions in plan view.

2. The manufacturing method as set forth in claim 1, wherein
   the implantation of the ions into the plurality of first-conductivity-type regions includes:
   forming a contact opening above a given one of the plurality of first-conductivity-type regions; and
   implanting ions into the contact opening to realize the second conductivity type trench spacer region.

3. The manufacturing method as set forth in claim 2, wherein
   the formation of the contact opening above the given one of the plurality of first-conductivity-type regions includes
   applying a contact resist, and
   the implantation of the ions into the contact opening to realize the second conductivity type trench spacer region includes
   implanting ions through the contact resist.

4. The manufacturing method as set forth in claim 3, wherein
   the formation of the contact opening above the given one of the plurality of first-conductivity-type regions includes
   forming an interlayer insulating film on the plurality of first-conductivity-type regions, and
   the implantation of the ions into the contact opening to realize the second conductivity type trench spacer region includes
   implanting ions through the interlayer insulating film formed on the plurality of first-conductivity-type regions.

5. The manufacturing method as set forth in claim 1, wherein
   prior to the formation of the second conductivity type trench spacer region, the plurality of first-conductivity-type regions are formed.

6. The semiconductor device as set forth in claim 1, wherein
   maximum depths of the second conductivity type trench spacer region that overlaps the plurality of first-conductivity-type regions in plan view are substantially the same as one another.

7. The semiconductor device as set forth in claim 6, wherein
   maximum depths of the second conductivity type trench spacer region that overlaps the plurality of second-conductivity-type regions adjacent to the plurality of first-conductivity-type regions in plan view are substantially the same as one another.

8. The manufacturing method as set forth in claim 1, wherein the second conductivity type trench spacer region that overlaps the given one of the plurality of first-conductivity-type regions is formed by an ion implantation having an accelerating voltage no more than 150 keV.

* * * * *